US009136150B2

(12) United States Patent
Hayashi et al.

(10) Patent No.: US 9,136,150 B2
(45) Date of Patent: Sep. 15, 2015

(54) SUBSTRATE PROCESSING APPARATUS, SUBSTRATE PROCESSING METHOD AND NON-TRANSITORY STORAGE MEDIUM

(71) Applicant: Tokyo Electron Limited, Tokyo (JP)

(72) Inventors: Tokutarou Hayashi, Koshi (JP); Yuichi Douki, Koshi (JP); Hirotoshi Mori, Koshi (JP); Akihiro Teramoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 285 days.

(21) Appl. No.: 13/759,471

(22) Filed: Feb. 5, 2013

(65) Prior Publication Data

US 2013/0202388 A1    Aug. 8, 2013

(30) Foreign Application Priority Data

Feb. 7, 2012    (JP) ................. 2012-024151

(51) Int. Cl.
G06F 7/00 (2006.01)
G05B 19/18 (2006.01)
B63B 27/00 (2006.01)
B65H 1/00 (2006.01)
H01L 21/677 (2006.01)
H01L 21/673 (2006.01)
H01L 21/67 (2006.01)

(52) U.S. Cl.
CPC ............ *H01L 21/677* (2013.01); *H01L 21/673* (2013.01); *H01L 21/67178* (2013.01); *H01L 21/67184* (2013.01); *H01L 21/67259* (2013.01); *H01L 21/67288* (2013.01); *H01L 21/67742* (2013.01)

(58) Field of Classification Search
None
See application file for complete search history.

(56) References Cited

U.S. PATENT DOCUMENTS

2008/0304952 A1    12/2008  Kondoh et al.
2009/0053023 A1*    2/2009  Wakabayashi ........... 414/222.13
2011/0178631 A1    7/2011  Kondoh et al.

FOREIGN PATENT DOCUMENTS

| JP | 08-031905 A1 | 2/1996 |
| JP | 2003-110004 A1 | 4/2003 |
| JP | 2006-351884 A1 | 12/2006 |
| JP | 2007-251090 A1 | 9/2007 |
| JP | 2008-053552 A1 | 3/2008 |
| JP | 2010-201556 A1 | 9/2010 |

OTHER PUBLICATIONS

Japanese Office Action (Application No. 2012-024151) dated Apr. 22, 2014.

* cited by examiner

*Primary Examiner* — Yolanda Cumbess
(74) *Attorney, Agent, or Firm* — Burr & Brown, PLLC

(57) ABSTRACT

There is provided a technique which can prevent poor processing of successive substrates in the event of a failure of a module or a transport mechanism for transporting a substrate between modules. A substrate processing apparatus includes: a plurality of modules from which a substrate holder of a substrate transport mechanism receives a substrate; a sensor section for detecting a displacement of the holding position of a substrate, held by the substrate holder, from a reference position preset in the substrate holder; and a storage section for storing the displacement, detected when the substrate holder receives a substrate from each of the modules, in a chronological manner for each module. A failure of one of the modules or the substrate transport mechanism is estimated based on the chronological data on the displacement for each module, stored in the storage section. This enables an early detection of a failure or abnormality.

5 Claims, 22 Drawing Sheets

| | | COT1 | | COT2 | | | COT3 | | |
|---|---|---|---|---|---|---|---|---|---|
| | | ΔX | AVERAGE MOVEMENT VALUE | ΔY | AVERAGE MOVEMENT VALUE | ΔX | AVERAGE MOVEMENT VALUE | ΔY | AVERAGE MOVEMENT VALUE | ΔX | AVERAGE MOVEMENT VALUE | ΔY | AVERAGE MOVEMENT VALUE |

| | | COT1 | | | COT2 | | | | COT3 | | | |
|---|---|---|---|---|---|---|---|---|---|---|---|---|
| | | ΔX | AVERAGE MOVEMENT VALUE | ΔY | AVERAGE MOVEMENT VALUE | ΔX | AVERAGE MOVEMENT VALUE | ΔY | AVERAGE MOVEMENT VALUE | ΔX | AVERAGE MOVEMENT VALUE | ΔY | AVERAGE MOVEMENT VALUE |
| HISTORY OF WAFER RECEIVING OPERATION | LAST OPERATION | 0.020 | 0.021 | 0.030 | 0.030 | 0.022 | 0.022 | -0.030 | -0.029 | -0.050 | -0.050 | 0.010 | 0.005 |
| | LAST OPERATION BUT ONE | 0.025 | 0.022 | 0.035 | 0.030 | 0.020 | 0.022 | -0.023 | -0.028 | -0.045 | -0.049 | 0.005 | 0.003 |
| | LAST OPERATION BUT TWO | 0.022 | 0.021 | 0.031 | 0.028 | 0.025 | 0.024 | -0.035 | -0.030 | -0.055 | -0.052 | 0.000 | 0.002 |
| | ... | ... | ... | ... | ... | ... | ... | ... | ... | ... | ... | ... | ... |
| PRESENCE/ABSENCE OF ABNORMALITY | | | | | | PRESENCE/ABSENCE OF ABNORMALITY | | | | PRESENCE/ABSENCE OF ABNORMALITY | | | |

| | | HP1 | | HP2 | | | ... |
|---|---|---|---|---|---|---|---|
| | | ΔX | AVERAGE MOVEMENT VALUE | ΔY | AVERAGE MOVEMENT VALUE | ΔX | AVERAGE MOVEMENT VALUE | ΔY | AVERAGE MOVEMENT VALUE | |
| HISTORY OF WAFER RECEIVING OPERATION | LAST OPERATION | 2.735 | 1.985 | 1.890 | 1.458 | ... | ... | ... | ... | |
| | LAST OPERATION BUT ONE | 1.500 | 1.003 | 0.440 | 0.230 | ... | ... | ... | ... | |
| | LAST OPERATION BUT TWO | 0.035 | 0.041 | 0.030 | 0.028 | ... | ... | ... | ... | |
| | ... | ... | ... | ... | ... | ... | ... | ... | ... | |
| PRESENCE/ABSENCE OF ABNORMALITY | | | | | | PRESENCE/ABSENCE OF ABNORMALITY | | | | |

| TRANSPORT ARM A5 |
|---|
| PRESENCE/ABSENCE OF ABNORMALITY |

FIG. 12

|  | X-DIRECTION POSITION | Y-DIRECTION POSITION | Z-DIRECTION POSITION |
|---|---|---|---|
| COT1 | A1 | B1 | --- |
| COT2 | A2 | B2 | --- |
| COT3 | A3 | B3 | --- |
|  |  |  |  |
| HP1 | C1 | D1 | --- |
| HP2 | C2 | D2 | --- |
| HP3 | C3 | D3 | --- |
| ⌇ | ⌇ | ⌇ | --- |
| HP8 | C4 | D4 | --- |
|  |  |  |  |
| CPL2 | E1 | F1 | --- |
|  |  |  |  |
| TTS | G1 | H1 | --- |

| | | COT1 | | | COT2 | | | COT3 | | |
|---|---|---|---|---|---|---|---|---|---|---|
| | | ΔX | ΔY | AVERAGE MOVEMENT VALUE | ΔX | ΔY | AVERAGE MOVEMENT VALUE | ΔX | ΔY | AVERAGE MOVEMENT VALUE |
| HISTORY OF WAFER RECEIVING OPERATION | LAST OPERATION | 1.522 | 1.031 | 1.002 | 1.525 | 1.035 | 0.459 | 1.555 | 1.010 | 0.321 |
| | LAST OPERATION BUT ONE | 0.525 | 0.335 | 0.252 | 0.520 | 0.323 | 0.152 | 0.445 | 0.305 | 0.021 |
| | LAST OPERATION BUT TWO | 0.020 | 0.030 | 0.015 | 0.022 | -0.030 | 0.002 | -0.050 | 0.010 | -0.120 |
| | ... | ... | ... | ... | ... | ... | ... | ... | ... | ... |
| | | PRESENCE/ABSENCE OF ABNORMALITY | | | PRESENCE/ABSENCE OF ABNORMALITY | | | PRESENCE/ABSENCE OF ABNORMALITY | | |

| | | HP1 | | | HP2 | | | ... |
|---|---|---|---|---|---|---|---|---|
| | | ΔX | ΔY | AVERAGE MOVEMENT VALUE | ΔX | ΔY | AVERAGE MOVEMENT VALUE | |
| HISTORY OF WAFER RECEIVING OPERATION | LAST OPERATION | 1.635 | 1.090 | 0.525 | ... | ... | ... | |
| | LAST OPERATION BUT ONE | 0.530 | 0.440 | 0.128 | ... | ... | ... | |
| | LAST OPERATION BUT TWO | 0.035 | 0.030 | -0.052 | ... | ... | ... | |
| | ... | ... | ... | ... | ... | ... | ... | |
| | | PRESENCE/ABSENCE OF ABNORMALITY | | | PRESENCE/ABSENCE OF ABNORMALITY | | | |

| TRANSPORT ARM A5 |
|---|
| PRESENCE/ABSENCE OF ABNORMALITY |

|      | X-DIRECTION POSITION | Y-DIRECTION POSITION |
|------|----------------------|----------------------|
| COT1 | A1                   | B1                   |
| COT2 | A2                   | B2                   |
| COT3 | A3                   | B3                   |
|      |                      |                      |
| HP1  | C1                   | D1                   |
| HP2  | C2                   | D2                   |
| HP3  | C3                   | D3                   |
| ⁄    | ⁄                    | ⁄                    |
| HP8  | C4                   | D4                   |
| TTS  | E1                   | F1                   |

← 68

↓

|      | X-DIRECTION POSITION | Y-DIRECTION POSITION |
|------|----------------------|----------------------|
| COT1 | A1+EQUIVALENT OF AVERAGE ΔX VALUE | B1+EQUIVALENT OF AVERAGE ΔX VALUE |
| COT2 | A2+EQUIVALENT OF AVERAGE ΔX VALUE | B2+EQUIVALENT OF AVERAGE ΔX VALUE |
| COT3 | A3+EQUIVALENT OF AVERAGE ΔX VALUE | B3+EQUIVALENT OF AVERAGE ΔX VALUE |
|      |                      |                      |
| HP1  | C1+EQUIVALENT OF AVERAGE ΔX VALUE | D1+EQUIVALENT OF AVERAGE ΔX VALUE |
| HP2  | C2+EQUIVALENT OF AVERAGE ΔX VALUE | D2+EQUIVALENT OF AVERAGE ΔX VALUE |
| HP3  | C3+EQUIVALENT OF AVERAGE ΔX VALUE | D3+EQUIVALENT OF AVERAGE ΔX VALUE |
| ⁄    | ⁄                    | ⁄                    |
| HP8  | C4+EQUIVALENT OF AVERAGE ΔX VALUE | D4+EQUIVALENT OF AVERAGE ΔX VALUE |
| TTS  | E1+EQUIVALENT OF AVERAGE ΔX VALUE | F1+EQUIVALENT OF AVERAGE ΔX VALUE |

SUBSTRATE PROCESSING APPARATUS, SUBSTRATE PROCESSING METHOD AND NON-TRANSITORY STORAGE MEDIUM

CROSS-REFERENCE TO RELATED APPLICATION

This application claims the priority benefit of Japanese Patent Application No. 2012-024151, filed on Feb. 7, 2012, the disclosure of which is incorporated herein by reference in its entirety.

BACKGROUND OF THE INVENTION

1. Field of the Invention

The present invention relates to a substrate processing apparatus and method for processing a substrate while transporting the substrate between modules, and to a non-transitory storage medium storing a program for implementing the substrate processing method.

2. Description of Related Art

In a semiconductor device manufacturing process, for example, predetermined processing of a semiconductor wafer (hereinafter simply referred to as "wafer") is performed while wafers are sequentially transported by a substrate transport mechanism, called a transport arm, between a plurality of processing modules provided in a substrate processing apparatus, e.g. a coating/developing apparatus. When a wafer is transported, it is held by a holder provided in the transport arm.

There are cases where a wafer is held at a position displaced from a preset reference position in the holder due to a failure of a certain module or a failure of the transport arm itself. If such a failure becomes gradually larger, and therefore the displacement of the actual position of a wafer, held by the holder, from the reference position increases and an abnormality occurs in transport of the wafer, then a coating/developing apparatus indicates an alarm to the user and stops transport of wafers in the apparatus. However, because of displacement of the position of a wafer, held by the holder, from the reference position, the wafer will not be transferred to a proper position in a module. There is, therefore, the fear that wafers may continue to be processed in an abnormal manner in the module until the apparatus is stopped, resulting in poor processing of successive wafers.

Further, when wafer transport is stopped in a coating/developing apparatus due to a failure of a module, the stopping of transport will be continued until the module returns to normal operation. Even when wafer transport is stopped due to such a minor failure of a transport arm that can be easily corrected, the operation of the transport arm must be stopped. The stopping of wafer transport may therefore lower the operation rate of the coating/developing apparatus, resulting in decreased throughput.

Patent document 1 describes a technique involving correcting the amount of transport of a wafer between modules based on the position of a peripheral portion of the wafer, detected by a sensor, thereby eliminating a positional displacement of the wafer in the modules. Patent document 2 describes a technique involving determining the center position of a wafer from a detected position of a peripheral portion of the wafer and, based on a displacement of the center position from a predetermined reference position, controlling a transport arm so that it can transfer the wafer to a target transport position. These patent documents, however, fail to address the above-described problems, and the techniques disclosed cannot solve the problems.

PRIOR ART DOCUMENT

Patent document 1: Japanese Patent Laid-Open Publication No. H8-31905
Patent document 2: Japanese Patent Laid-Open Publication No. 2006-351884

SUMMARY OF THE INVENTION

The present invention has been made in view of the above situation. It is therefore an object of the present invention to provide a technique which can prevent poor processing of successive substrates in the event of a failure of a module or a transport mechanism for transporting a substrate between modules.

In order to achieve the present invention, the present invention provides a substrate processing apparatus for processing a substrate while transferring the substrate between modules, comprising: a substrate transport mechanism including a substrate holder for holding a substrate and which is movable laterally for transfer of the substrate between modules; a plurality of modules from which the substrate holder receives a substrate; a sensor section for detecting a displacement of the holding position of a substrate, held by the substrate holder, from a reference position preset in the substrate holder; a storage section for storing the displacement, detected when the substrate holder receives a substrate from each of the modules, in a chronological manner for each module; and an estimation section for estimating a failure of one of the modules or the substrate transport mechanism based on the chronological data on the displacement for each module, stored in the storage section.

The present invention provides another substrate processing apparatus for processing a substrate while transferring the substrate between modules, comprising: a substrate transport mechanism including a substrate holder for holding a substrate and which is movable laterally for transfer of the substrate between modules; a plurality of modules from which the substrate holder receives a substrate; a sensor section for detecting a displacement of the holding position of a substrate, held by the substrate holder, from a reference position preset in the substrate holder; a storage section for storing the displacement, detected when the substrate holder receives a substrate from each of the modules, in relation to the module; and a display section for displaying the displacement for each module, stored in the storage section.

The following are preferred embodiments of the present invention:

(a) A control means is provided which, based on the results of estimation in the estimation section, outputs a control signal to control the operation of the substrate transport mechanism.

(b) When a failure of the substrate transport mechanism is estimated in the estimation section, the control means changes the position of the substrate holder on receipt of a substrate from each module from a preset first position to a second position according to the displacement stored in the storage section.

(c) When a failure of the substrate transport mechanism is estimated in the estimation section, the control means outputs a control signal to cause the substrate transport mechanism to transfer a substrate to an adjustment module, one of the plurality of modules, and then receive the substrate from the adjustment module; and the control means, based on the difference between the displacement detected before transfer of the substrate to the adjustment module and the displacement detected after receipt of the substrate from the adjustment module, changes the position of the substrate holder on receipt of a substrate from each module from a preset first position to a second position.

When a failure of one of the modules is estimated in the estimation section, the control means outputs a control signal to cause the substrate transport mechanism to stop transporting a wafer to the module.

(d) An alarm output means is provided for outputting an alarm when a failure of one of the modules or the substrate transport mechanism is estimated in the estimation section.

According to the present invention, there is provided the storage section which stores the displacement of the holding position from the reference position upon transfer of a substrate to the substrate holder of the substrate transport mechanism. There is also provided the estimation section which, based on the displacement stored in the storage section in a chronological manner for each module, estimates a failure of one of the modules or the substrate transport mechanism, or is provided the display section which displays the displacement for each module, stored in the storage section. The present invention therefore makes it possible to early detect a failure or abnormality in a module or the substrate transport mechanism, thereby preventing poor processing of successive substrates.

BRIEF DESCRIPTION OF THE DRAWINGS

FIG. 12 is a conceptual diagram of a storage area of a storage section provided in the control section;

FIG. 13 is a conceptual diagram of a storage area of a storage section provided in the control section;

FIG. 21 is a conceptual diagram of a storage area of a storage section provided in the control section;

FIG. 22 is a diagram illustrating change of data on wafer transfer positions;

DETAILED DESCRIPTION OF THE INVENTION

Figure 1:
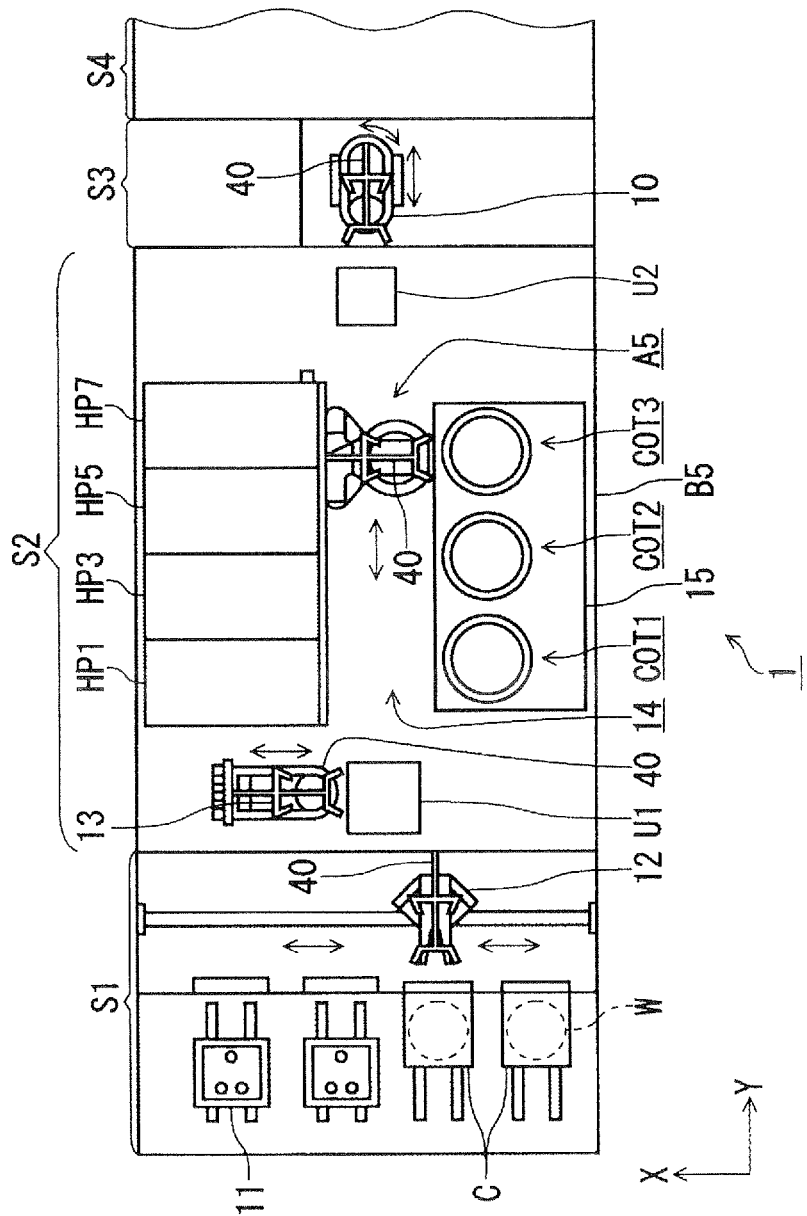
FIG. 1 is a plan view of a coating/developing apparatus which is an embodiment of the substrate processing apparatus according to the present invention.
Figure 2:
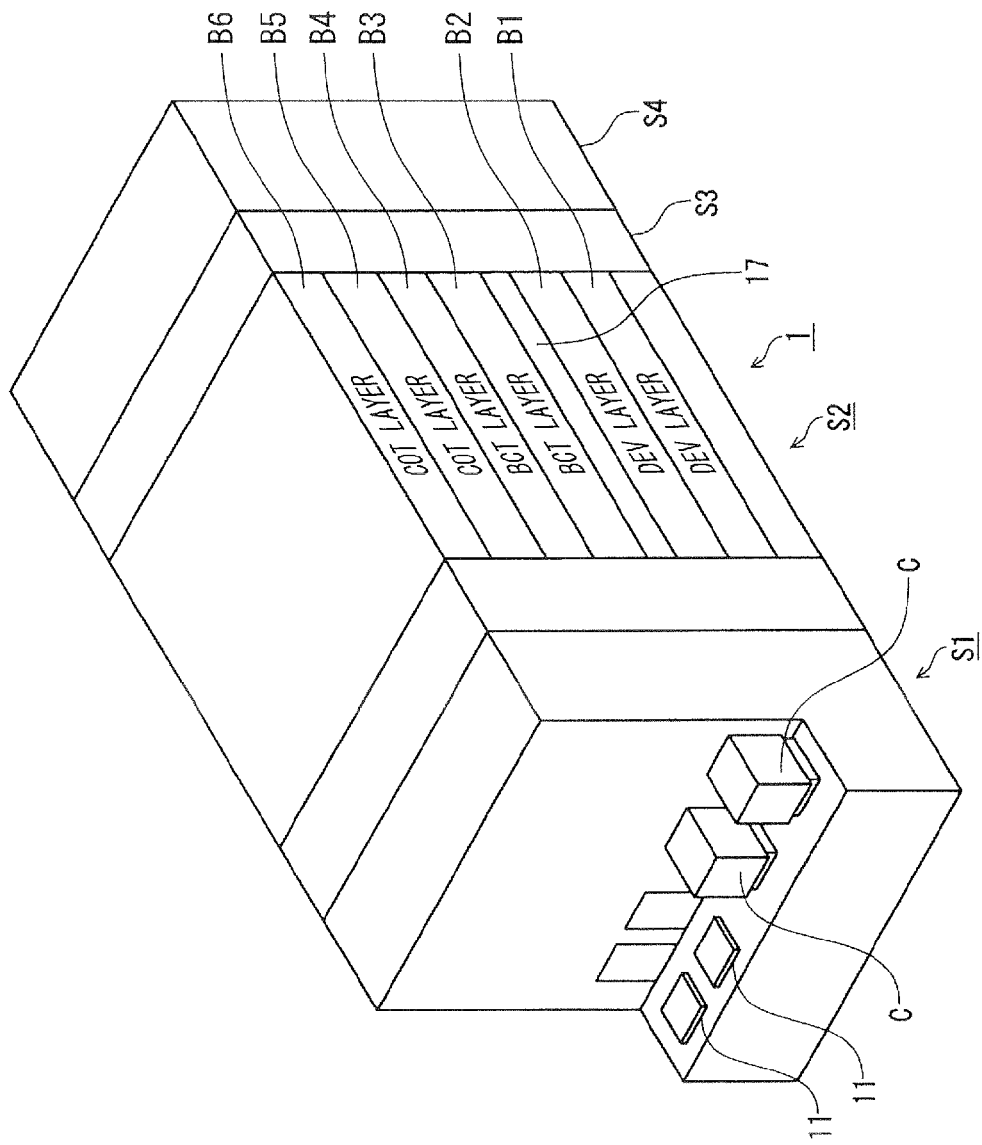
FIG. 2 is a perspective view of the coating/developing apparatus.
Figure 3:
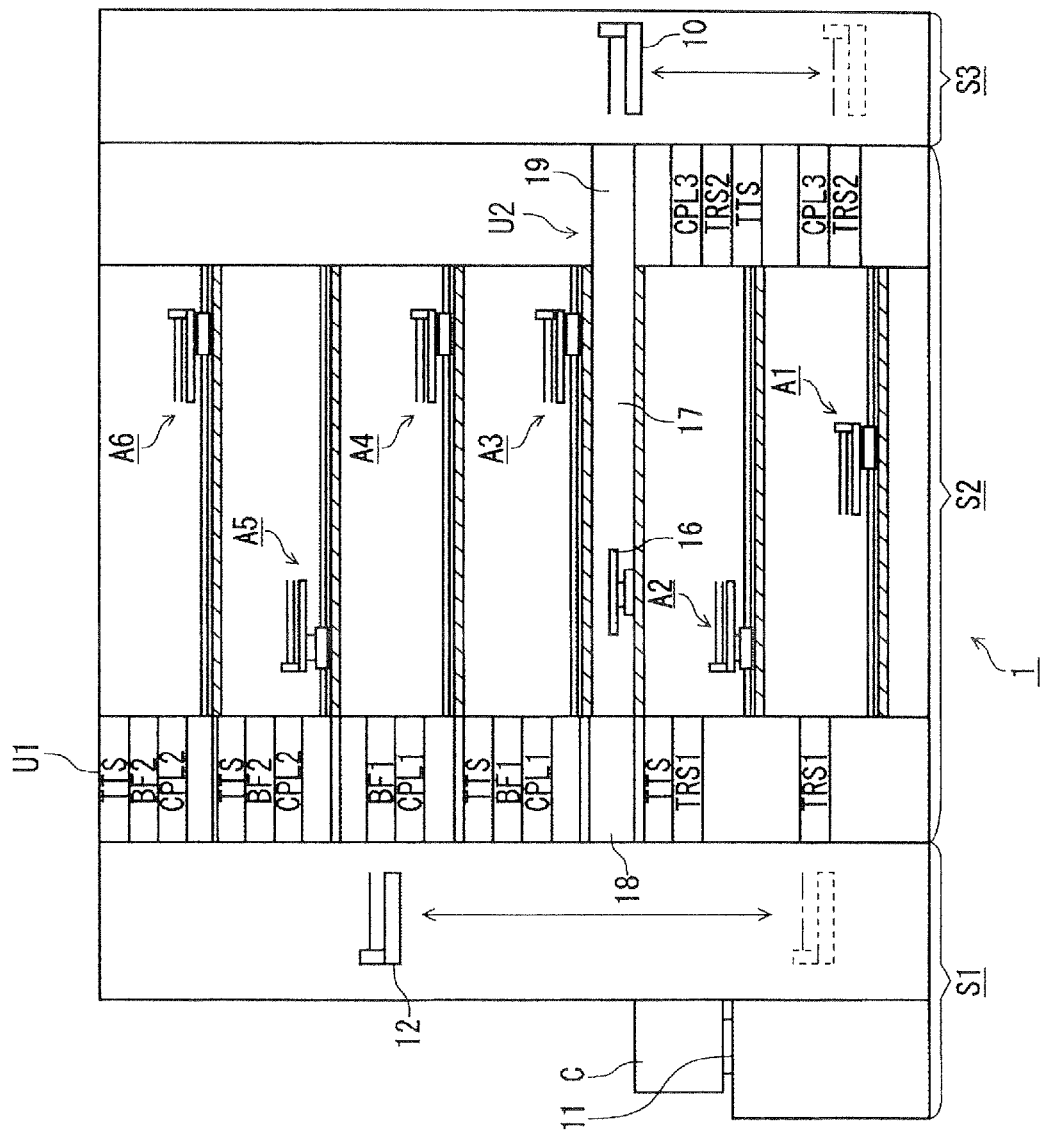
FIG. 3 is a side view of the coating/developing apparatus.

FIG. 1, FIG. 2 and FIG. 3 are a plan view, a schematic perspective view and a side view, respectively, of a coating/developing apparatus 1 which is an embodiment of the substrate processing apparatus according to the present invention. As shown in these Figures, the coating/developing apparatus 1 consists of a carrier block S1, a processing block S2 and an interface block S3. An exposure apparatus S4 is connected to the interface block 53. The coating/developing apparatus 1 and the exposure apparatus S4 constitute a resist pattern forming apparatus.

The carrier block S1 is a block for carrying a carrier C, in which a plurality of wafers W as substrates are housed, into and out of the apparatus, and includes stages 11 and a transfer arm 12 as a substrate transport mechanism. One carrier C is placed on each stage 11. The transfer arm 12 takes a wafer W out of a carrier C and transfers the wafer W to the processing block S2. On the other hand, the transfer arm 12 receives a processed wafer W which has undergone processing in the processing block S2 and transfers the wafer W to the carrier C.

As shown in FIGS. 1 and 2, the processing block S2 includes a shelf unit U1, a shelf unit U2, a first block (DEV layer) B1, a second block (DEV layer) B2, a third block (BCT layer) B3, a fourth block (BCT layer) B4, a fifth block (COT layer) B5, and a sixth block (COT layer) B6. The first and second blocks (DEV layers) B1, B2 are blocks for performing developing processing and have the same construction. The third and fourth blocks (BCT layers) B3, B4 are blocks for forming an antireflective film underlying a resist film and have the same construction. The fifth and sixth blocks (COT layers) B5, B6 are blocks for applying a resist solution to the antireflective film to form a resist film.

Wafers W, which have been successively carried out of the carrier C, are transported alternately to the unit blocks B3 and B4 in normal operation. A wafer W which has been transported to the unit block B3 is transported and processed e.g. in the order of B5→B1. A wafer W which has been transported to the unit block B4 is transported and processed e.g. in the order of B6→B2.

The shelf unit U1 is comprised of a stack of various modules. As shown in FIG. 3, the shelf unit U1 has transfer modules TRS1, TRS1, CPL1, BF1, CPL1, BF1, CPL2, BF2, CPL2 and BF2, arranged in this order from the lowest one. The transfer modules TRS are provided at height positions corresponding to the unit blocks B1, B2, and the transfer modules CPL, BF are provided at height positions corresponding to the unit blocks B3 to B6. The below-described position adjustment modules TTS are provided at height positions corresponding to the unit blocks B2, B3, B5, B6. As shown in FIG. 1, a lifting arm 13, a vertically-movable substrate transport mechanism, is provided in the vicinity of the shelf unit U1. A wafer W is transported by the lifting arm 13 between the processing modules of the shelf unit U1.

The shelf unit U2 is comprised of a stack of various modules. As shown in FIG. 3, the shelf unit U2 has transfer modules TRS2, CPL3 at height positions corresponding to the unit blocks B1, B2. In FIG. 3, the transfer modules with the symbol CPL each also function as a cooling module for temperature control, and the transfer modules with the symbol BF each also function as a buffer module capable of placing thereon a plurality of wafers W. The shelf unit U2 also has a position adjustment module TTS at a height position accessible by the below-described interface arm.

Figure 4:
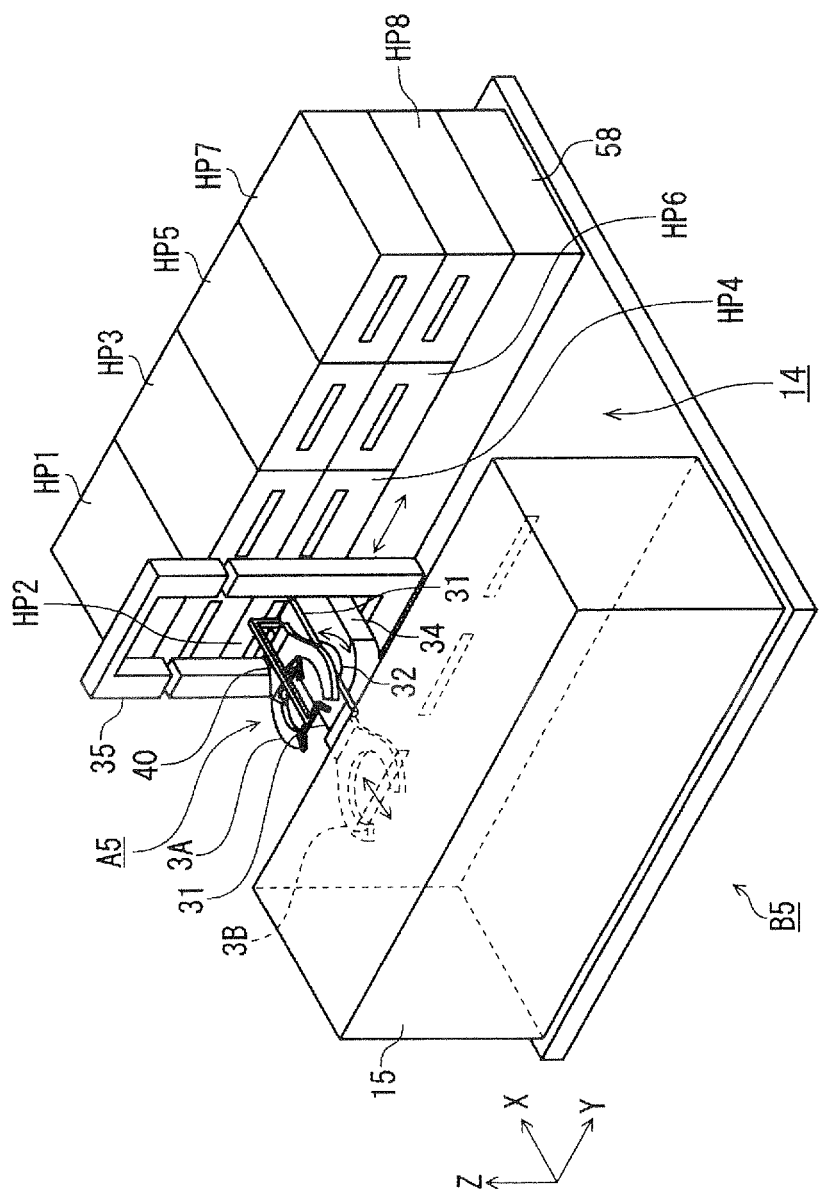
FIG. 4 is a perspective view of a transport arm and modules, provided in the coating/developing apparatus.

FIG. 4 is a perspective view of the fifth unit block (COT layer) B5. The unit block B5 has a transport path 14 extending from the carrier block S1 side to the interface block S3 side. When the transport path 14 is viewed in a direction toward the interface S3, heating modules HP1 to HP8, arranged in a two-layer stack, are provided along the left side of the transport path 14, while a chassis 15 having, in its interior, three resist coating modules COT (COT1 to COT3) is provided along the right side of the transport path 14. The resist coating modules COT each apply a resist solution to a wafer W to form a resist film. In the transport path 14 is provided the below-described transport arm A5 as a substrate transport mechanism, which transports a wafer W between the modules of the unit block B5.

The third and fourth unit blocks (BCT layers) B3, B4 have the same construction as the unit blocks B5, B6 except that antireflective film forming modules BCT are provided instead of the resist coating modules COT. The antireflective film forming modules BCT each apply an antireflective film-forming chemical solution to a wafer W to form an antireflective film. The first and second unit blocks B1, B2 have the same construction as the unit blocks B5, B6 except that developing modules DEV for carrying out developing processing by supplying a developer to a wafer W are provided instead of the resist coating modules COT. Transport arms A1 to A4 and A6, each having the same construction as the transport arm A5, are provided in the unit blocks B1 to B4 and B6, respectively.

A block 17, which serves as a travel path for a shuttle 16, is provided between the unit blocks B2 and B3. The shuttle 16 transports a wafer W from a wafer entrance 18, provided in the shelf unit U1, directly to a wafer exit 19 provided in the shelf unit U2. As shown in FIG. 1, the interface block S3 has an interface arm 10 as a substrate transport mechanism in the vicinity of the shelf unit U2. The interface arm 10 transports a wafer W between each module of the shelf unit U2 and the exposure apparatus 54.

Transport of wafers W during normal operation will now be described. Wafers W in the carrier C are sequentially transported by the transport arm 12 to one of the transfer modules of the shelf unit U1, e.g. the transfer module CPL1 corresponding to the third block (BCT layer) B3. Each wafer W is transferred to the transport arm A3 of the third block (BCT layer) B3, and is transported by the transport arm A3 to an antireflective film forming module and then to a heating module, whereby an antireflective film is formed on the wafer W.

The wafer W after the formation of the antireflective film is transported to the transport arm A5 of the fifth block (COT layer) B5 via the transfer arm A3, the transfer module BF1 of the shelf unit U1, the lifting arm 13 and the transfer module CPL2 of the shelf unit U1 in this order. The wafer W is then transported by the transport arm A5 to a resist coating module COT and then to a heating module HP, whereby a resist film is formed on the wafer W.

The wafer W after the formation of the resist film is transported by the transport arm A5 to the transfer module BF2 of the shelf unit U1, and then transferred in the order of: the lifting arm 13, the shuttle 16 and the interface arm 10. The wafer W is then transported via the interface arm 10 to the exposure apparatus S4, where the wafer W is subjected to predetermined exposure processing. Thereafter, the wafer W is transported via the interface arm 10 to the transfer module TRS2 of the shelf unit U2 and placed on it. The wafer W is then transported by the transport arm A1 of the first block (DEV layer) B1 in the following order: a heating module, the transport module CPL3, a developing module DEV, a heating module, the transfer module TRS1. The wafer W is then returned via the transfer arm 12 to the carrier C.

While the wafer transport route has been described with reference to a wafer W which is subjected to processing in the blocks B1, B3, B5, a wafer W which is subjected to processing in the blocks B2, B4, B6 is transported in substantially the same manner, except that the wafer W is transported by the transport arms A2, A4, A6 of the blocks B2, B4, B6, and that the wafer W is transported to those transfer modules of the shelf units U1, U2 which are located at positions corresponding to the blocks B2, B4, B6.

On behalf of the substrate transport mechanisms of the coating/developing apparatus 1, the transport arm A5 will now be described in detail with reference to FIG. 4. The transport arm A5 includes forks 3 (3A, 3B) as a wafer holder, a base 31, a rotating mechanism 32, a lifting stage 34 and a substrate peripheral position detection mechanism 40. The forks 3A, 3B are provided on the base 31 such that the forks vertically overlap each other. The transport arm A5 receives a wafer W from a module with one fork, and transfers a wafer W to the module with the other fork. Thus, the transport arm A5 operates in such a manner as to trade wafers W with the module. The base 31 is provided on the lifting stage 34, and is rotatable on a vertical axis by means of the rotating mechanism 32.

The lifting stage 34 is disposed such that it is surrounded by a vertically extending frame 35, and moves vertically (Z direction in FIG. 1). In the frame 35 is provided a lifting mechanism for vertically moving the lifting stage 34. The frame 35 is configured to slide on a Y-axis guide rail (not shown) extending linearly and laterally (Y direction in FIG. 1).

Figure 5:
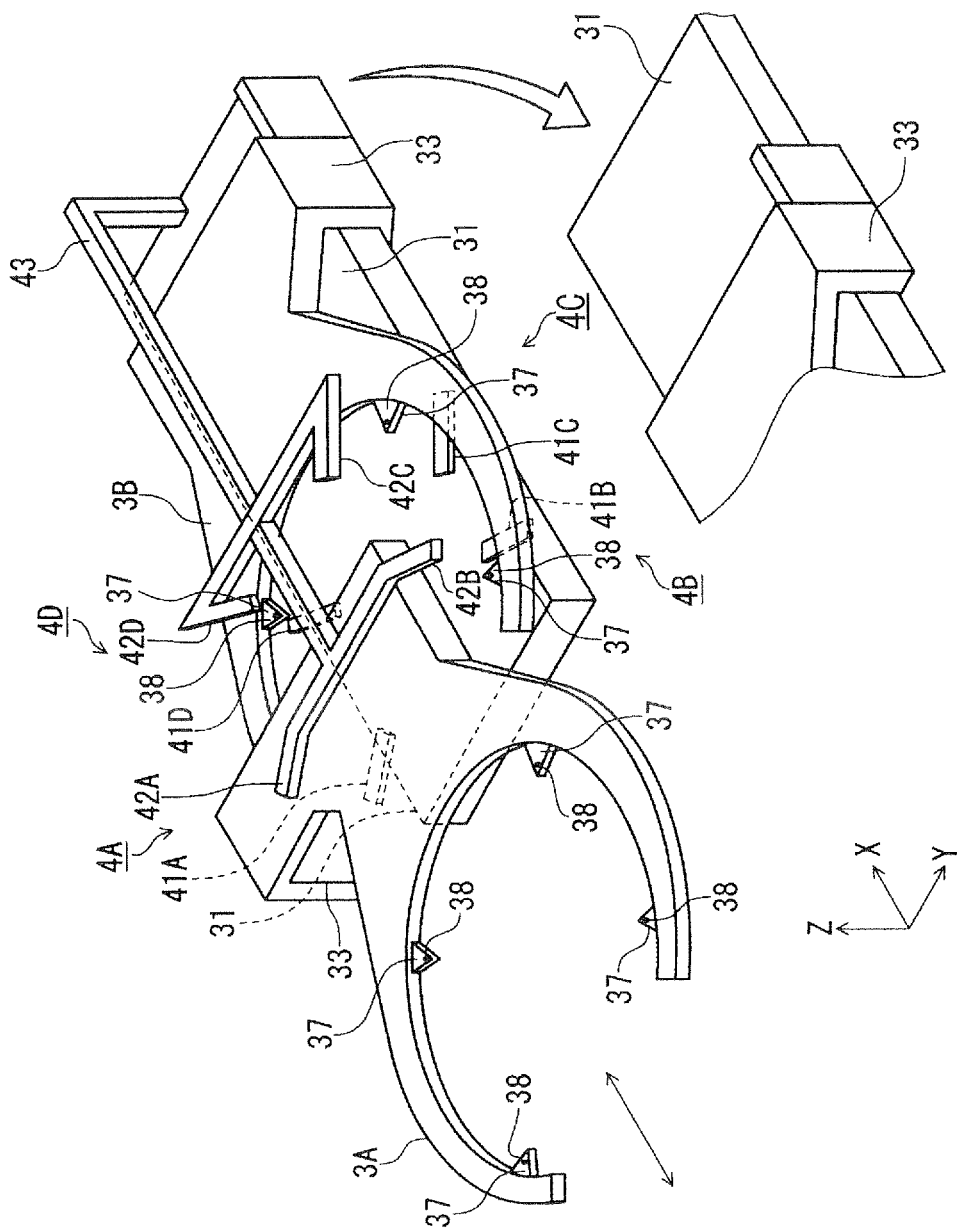
FIG. 5 is a perspective view of a base and a fork, provided in the transport arm.
Figure 6:
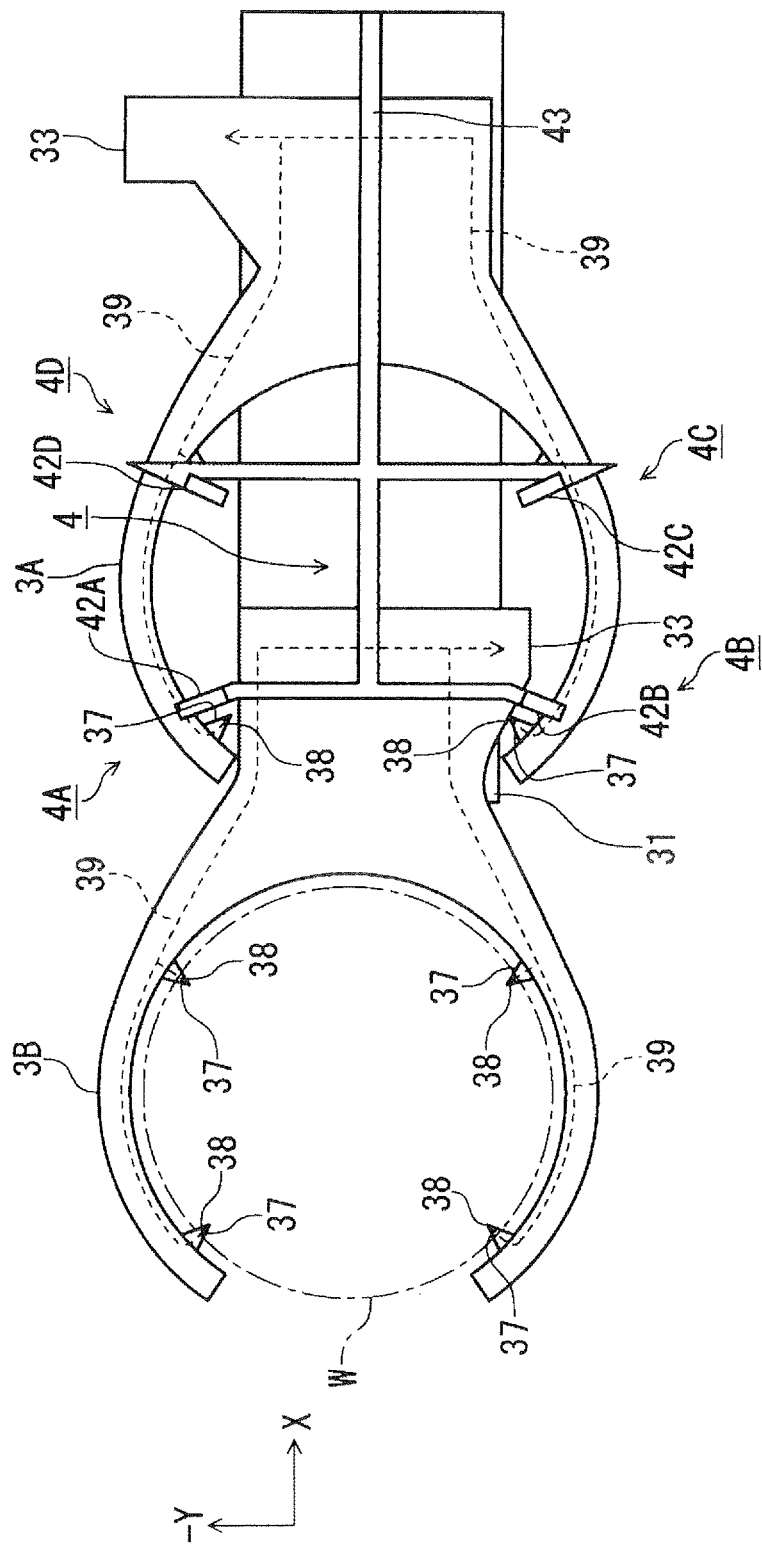
FIG. 6 is a plan view of the base and the fork.
Figure 7:
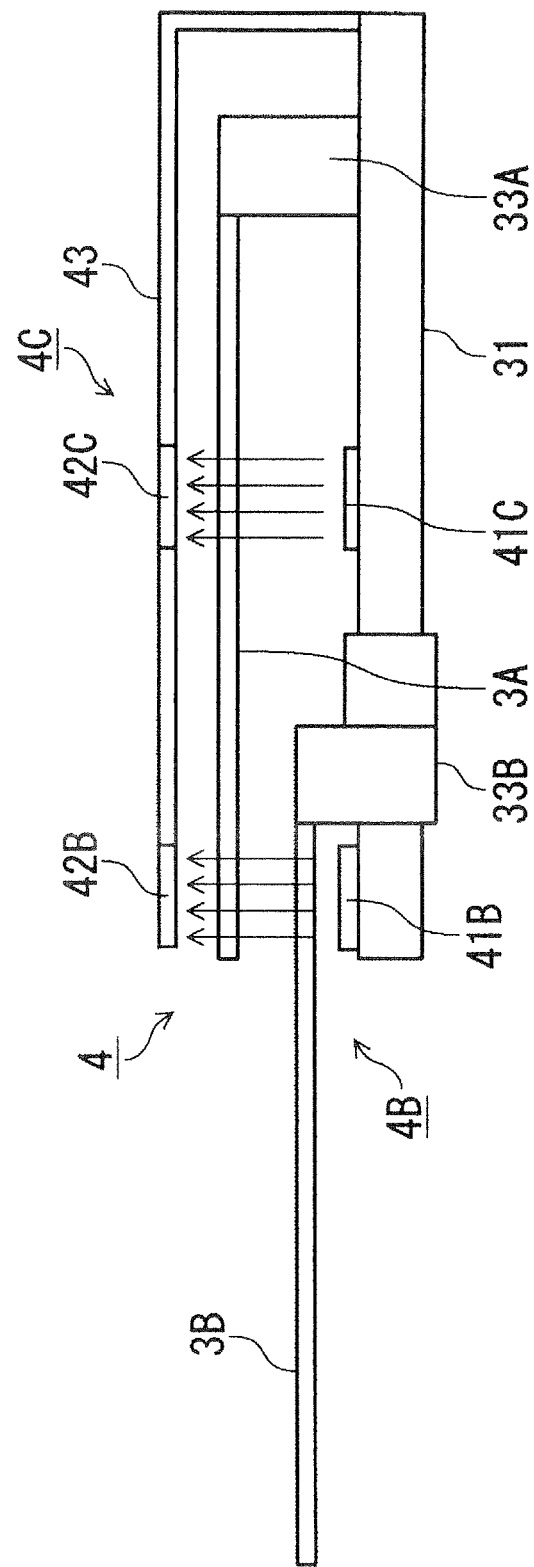
FIG. 7 is a side view of the base and the fork.

The forks 3A, 3B and base 31 of the transport arm A5 will be further described with reference also to FIGS. 5, 6 and 7 which are a perspective view, a plan view and a side view, respectively. The forks 3A, 3B have the same construction, and hence the following description will be given mainly of the fork 3A. The fork 3A has the shape of an arc-like flat plate and, as shown in FIG. 6, is configured to surround the periphery of a wafer W to be transported. The inner periphery of the fork 3A is designed to be slightly larger than the periphery of a wafer W so that the wafer W can be transported even when the position of the wafer W is slightly displaced during its transportation. Four holding claws 37, projecting inwardly and spaced apart from each other, for placing thereon peripheral portions of the back surface of a wafer W, are provided on the lower side of the inner periphery of the fork 3A, 3B. In the Figures, reference numeral 33 denotes a support portion for supporting the fork 3A, 3B on the base 31.

The holding claws 37 each have a vacuum suction opening 38 which, when a peripheral portion of the back surface of a wafer W is placed on the holding claws 37, attracts the peripheral portion of the substrate W so that the wafer W is held on the holding claws 37. In FIG. 6, reference numeral 39 denotes piping connected to the vacuum suction openings 38 and which is provided in both of the forks 3A, 3B. The vacuum attraction of a wafer W enables positioning of the horizontal positions of the peripheral portions of the wafer W.

Figure 8:
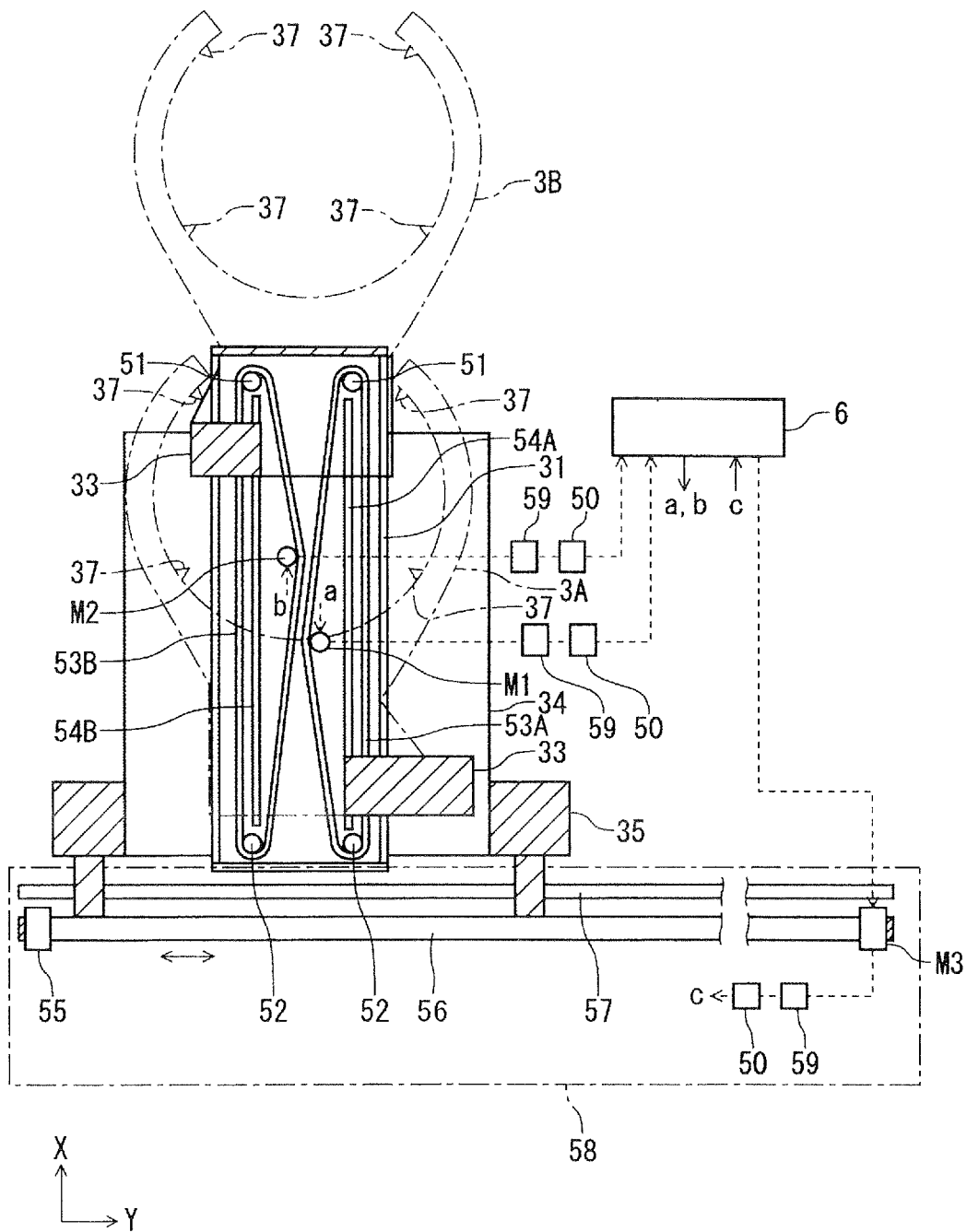
FIG. 8 is a cross-sectional plan view of the transport arm.

FIG. 8 is a cross-sectional plan view of the transport arm A5. In FIG. 8, M1 and M2 each denote a motor, and 51 and 52 are pulleys which form a group with each of the motors M1, M2. 53A, 53B each denote a belt wound around the motor and the pulleys. The support portions 33 of the forks 3A, 3B engage the belts 53A, 53B, respectively. In FIG. 8, 54A, 54B each denote a guide connected to the support portion 33 of each fork 3. The rotation of the motor M1 and the rotation of the motor M2 are each controlled by a control signal which is sent from the below-described control section 6. The belts 53A, 53B are driven by the rotation of the motors, whereby the respective support portions 33 slide on the guides 54A, 54B, and the forks 3A, 3B move back and forth on the base 31 independently of each other.

In FIG. 8, M3 denotes a motor and 55 denotes a pulley paired with the motor M3. Reference numeral 56 denotes a belt wound around the motor and the pulley. The frame 35 engages the belt 56. Reference numeral 57 denotes a guide connected to the frame 35. The rotation of the motor M3 is controlled by the same control section 6 that controls the forks 3. By the rotation of the motor M3, the frame 35 slides on the guide 57 and moves in the Y-axis direction along with the base 31. The motor M3, the pulley 55, the belt 56 and the guide 57 are housed in a chassis 58 disposed beneath the heating modules HP.

Though not shown diagrammatically, as with the movement of the forks 3, the vertical movement of the base 31 by means of the lifting base 34 is performed through a movement mechanism comprised of a motor M4, a belt and a guide. The rotation of the base 31 is performed by a not-shown movement mechanism comprised of a motor M5 and a belt. To each of the motors M1 to M5 of the transport arm A5 are connected an encoder 59 for outputting pulses according to the rotation of the motor, and a counter 50 for counting the number of the pulses and outputting a signal, corresponding to the count value, to the control section 6. Based on the output of each counter 50, the control section 6 can detect the positions of various portions of the transport arm A5.

Returning to FIGS. 5 through 7, the substrate peripheral position detection mechanism 40 will now be described. The substrate peripheral position detection mechanism 40, constituting a sensor section, consists of four detection sections 4 (4A to 4D) and, when the fork 3A or 3B, holding a wafer W, is in a backward position, detects the positions of different peripheral portions of the wafer W. The detection sections 4A to 4D are provided such that in a plan view, they overlap the peripheral portions of the wafer W held by the fork 3A or 3B in the backward position, and that they extend from the outer side toward the inner side of the wafer W. In FIGS. 6 and 7, the fork 3A is in the backward position, whereas the fork 3B is in a transfer position for transferring a wafer W to or from a module. The detection sections 4A to 4D are provided along the periphery of the wafer W at a distance from each other so that they can detect different peripheral positions of the wafer W.

The detection sections 4A to 4D consist of four light sources 41 (41A to 41D) and four light receivers 42 (42A to 42D) paired with the light sources 41. The light sources 41 (41A to 41D) each include e.g. an LED (light emitting diode), provided on the base 31 and located below the forks 3A, 3B in the backward position. Each light source 41 has a not-shown lens so that light from the LED, passing through the lens, travels vertically upward as shown by the arrows in FIG. 7. Four light irradiation areas, each extending linearly from the periphery toward the center of the wafer W in a plan view, are formed by light from the light sources 41 on the wafer W held by the fork 3 in the backward position.

The light receivers 42 are each a linear image sensor (LIS) comprised of a plurality of linearly-arranged light receiving elements. The light receiving element is, for example, a charge coupled device (CCD). The light receivers 42 are mounted via a support member 43 on the base 31 and located above the forks 3A, 3B. Thus, the pairs of the light sources 41 and the light receivers 42 are provided on both sides of the wafer W held by the fork 3A or 3B in the backward position. The light receiving elements of each light receiver 42 are arranged in an area extending from the outside toward the center of the wafer W so that they can receive light from the corresponding light source 41.

When the fork 3, holding a wafer W, stays motionless in the backward position or in a position slightly advanced from the backward position, the light sources 41 emit light upwardly. The light emitted is received by the light receivers 42 provided above the fork 3. Based on detection values for CCDs which are pixels of each light receiver 42, the below-described control section 6 can determine the position of the boundary between pixels which have received light and pixels which have not received light. The determined boundary position can be expressed in coordinates with a predetermined position as the origin of an XY plane and, as described below, the center position and the radius of the wafer W can be calculated. In the XY plane, the Y direction is the direction of movement of the base 31, and the X direction is perpendicular to the Y direction and is the direction of movement of the forks 3.

Figure 9:
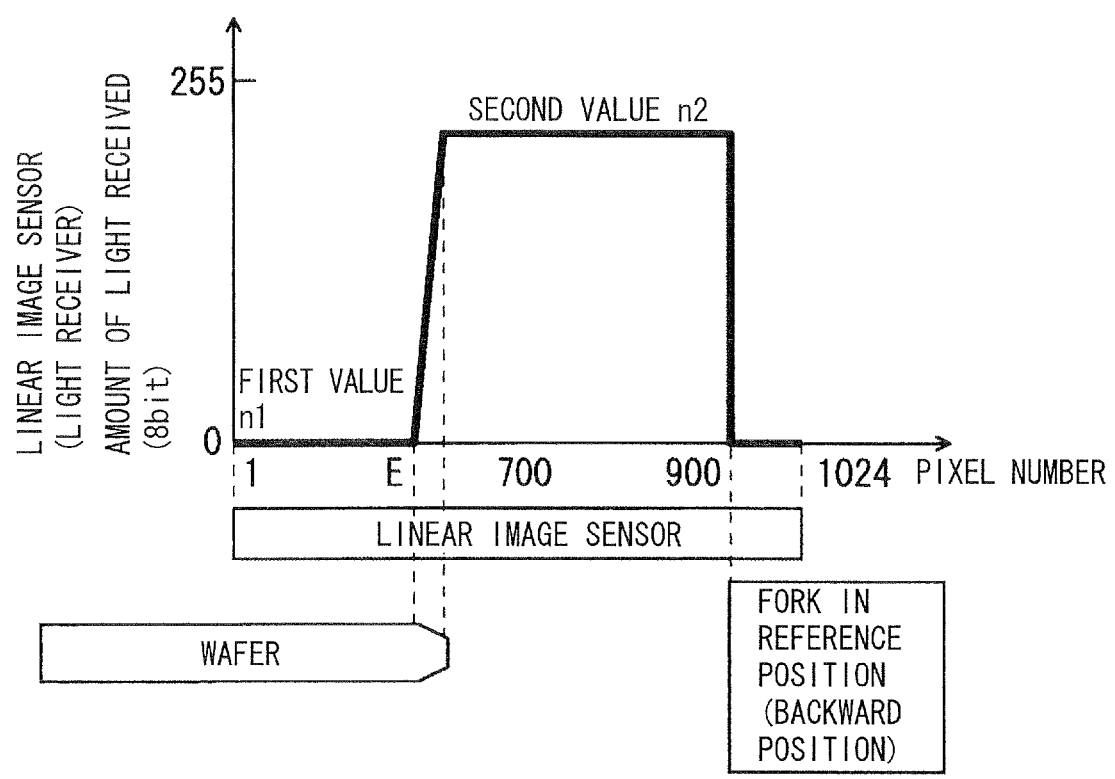
FIG. 9 is a diagram illustrating an example of the results of detection by a detection section provided in the transport arm.

The manner of detecting the position of the above-described boundary, i.e. the position of the peripheral portion of a wafer W, by means of each light receiver 42 will now be described with reference to FIG. 9. FIG. 9 is a diagram schematically showing the relationship of the positions of a wafer W and the fork 3 with the amount of light received by each light receiving element (pixel) of the light receiver (linear image sensor) 42. In FIG. 9, the first value n1 denotes the detection value (hereinafter referred to as "the amount of light received") of pixels that have not received light emitted by the light source 41, and the second value n2 denotes the amount of light received by pixels that have received light emitted by the light source 41. The position of the peripheral portion of the wafer W can be detected as the position E where the amount of light received by pixels changes between the first value n1 and the second value n2.

When processing the amount of light received as 8-bit data, the first value n1 can be represented by, for example, 0, and second value n2 can be represented by, for example, a predetermined value of not more than 255. Referring to FIG. 9, pixels are numbered starting from the innermost one nearest to the center of the wafer W; and the pixel number 900 denotes the innermost one of those light receiving elements which do not receive light emitted by the light source 41 because the light is blocked by the fork 3 in the reference position (backward position). Thus, the light receivers 42 are each configured as a CCD line sensor which detects the position of the peripheral portion of a wafer W in the longitudinal direction of the light receiver 42.

Figure 10:
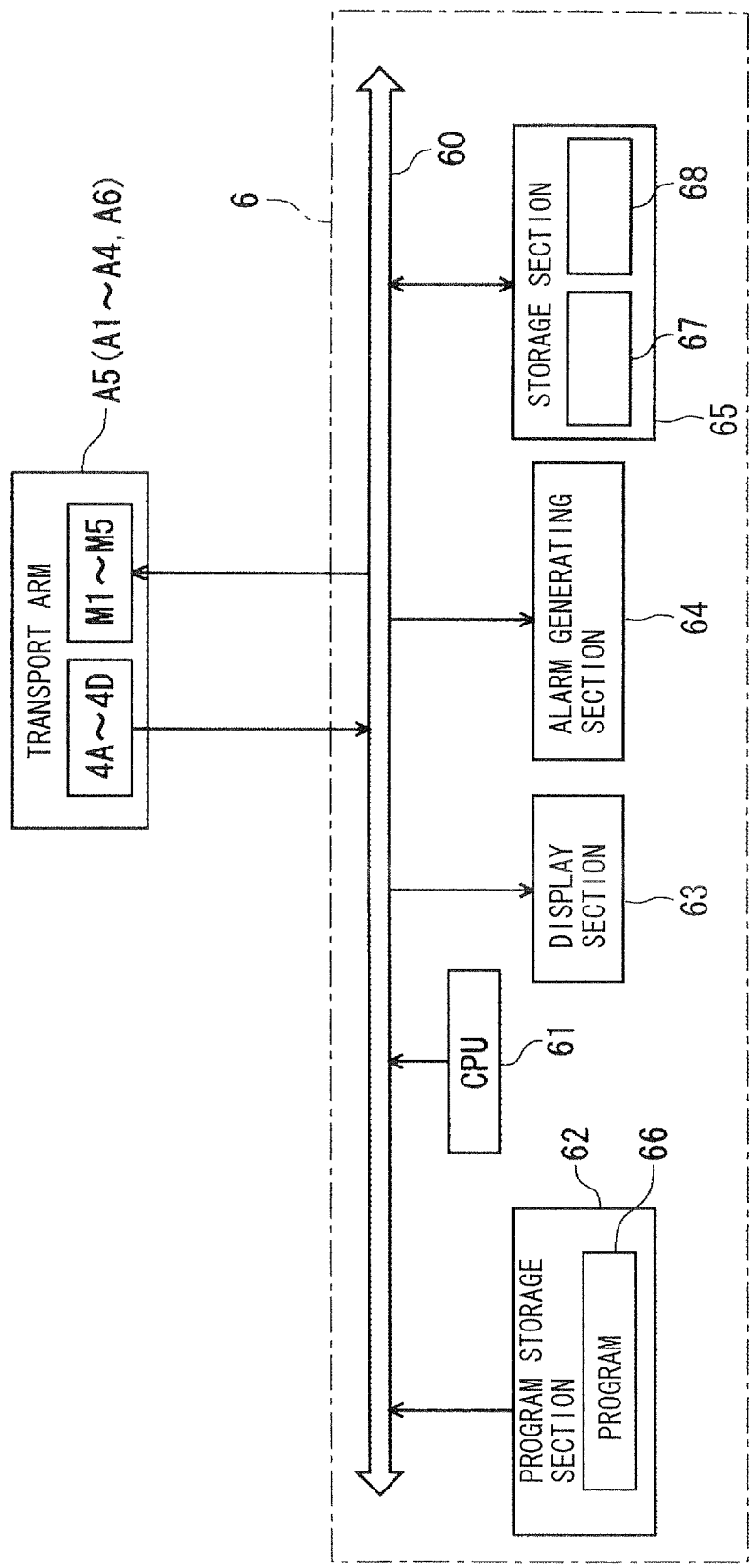
FIG. 10 is a block diagram of a control section provided in the coating/developing apparatus.

The control section 6, serving as an estimation section, will now be described with reference to FIG. 10. The control section 6 includes a CPU (central processing unit) 61, a program storage section 62, a display section 63, an alarm generating section 64 and a storage section 65. In FIG. 10, reference numeral 60 denotes a bus. The CPU 61 reads a program 66 stored in the program storage section 62, and sends control signals to various components of the apparatus according to instructions (commands) contained in the program 66 so as to control the operations of the substrate transport mechanisms, such as the transport arm A5, and the operations of the modules and to also control the above-described and below-described transport of wafers W. The program storage section 62 is a computer-readable non-transitory storage medium and may be comprised of a flexible disk, a compact disk, a hard disk, a magneto-optical (MO) disk, or the like. The storage section 65 has a first storage area 67 and a second storage area 68.

The fork 3 (3A or 3B) of each transport arm A moves on the base 31 to a forward position and receives a wafer W from a module, and then moves on the base 31 to the backward position, where the peripheral areas of the wafer W are irradiated with light by means of the detection sections 4. On receiving light from each light source 41, the corresponding light receiver 42, based on timing of a control signal from a not-shown CCD line sensor control section, outputs a signal corresponding to the amount of light received by pixels by charge transfer in the light receiver 42. The signal (detection value) is inputted into the control section 6, and the center position (center coordinates) O' (X', Y') of the wafer W in the XY plane is calculated by the below-described arithmetic expression.

Figure 11:
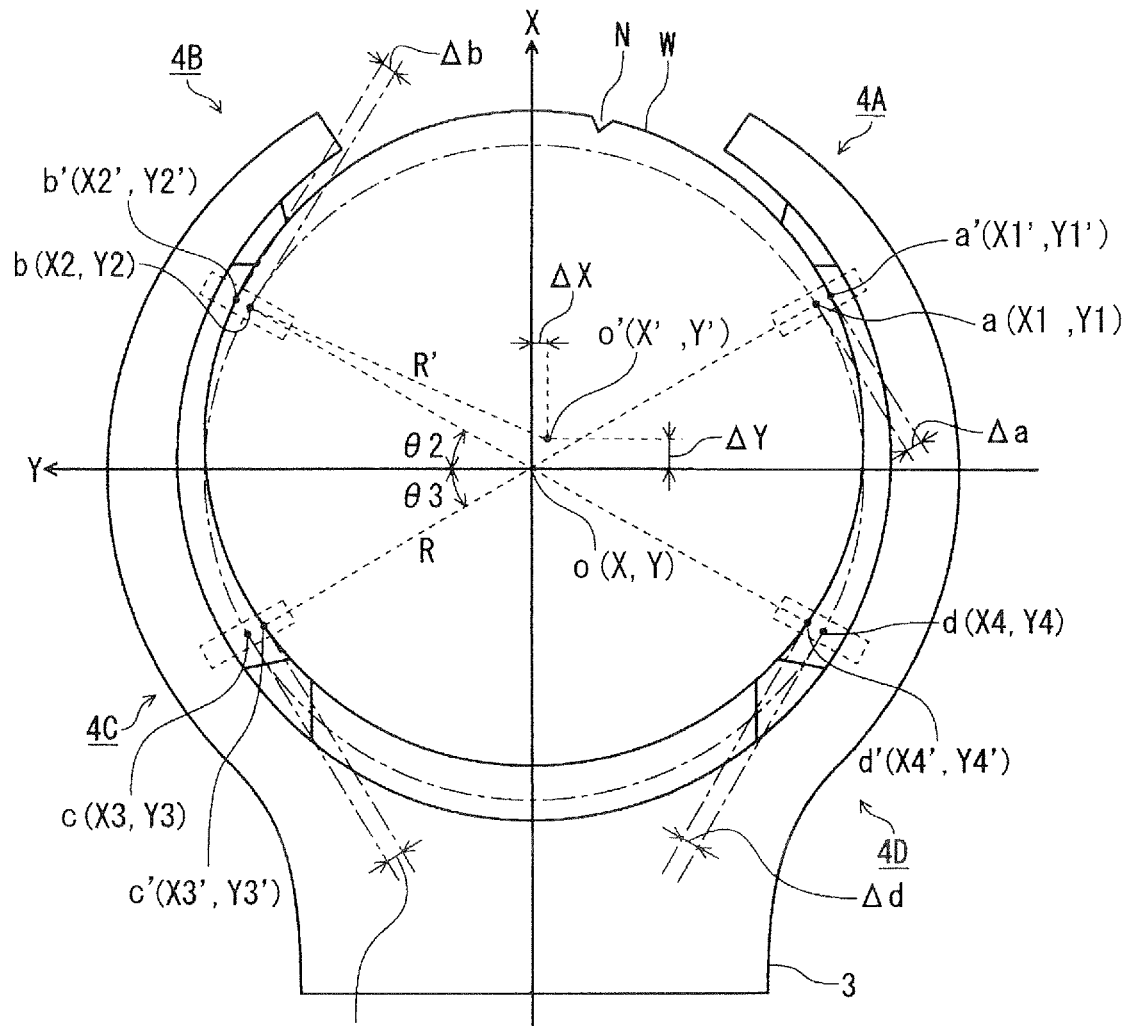
FIG. 11 is a plan view illustrating different positions of a wafer held by the fork.

FIG. 11 shows the fork 3 which has received a wafer W from a module and then moved to the backward position, and illustrates an example of the center position o' detected. In FIG. 11, "O (X, Y)" denotes a reference position set inside the arc of the fork 3. During normal operation of the transport arm A, the center position o' should preferably be as close to the reference position o as possible in order to properly transport the wafer W to a module. The chain-line circle in FIG. 11 indicates the contour of a wafer W held such that the center position o' coincides with the reference position o.

Every time the fork 3 receives a wafer W from a module, the control section 6 calculates displacements ΔX, ΔY of the center position o' of the wafer W from the reference position o in the X and Y directions as described below, and stores the displacements in the first storage area 67. FIG. 12 schematically shows data stored in the first storage area 67. The unit for the numerical values shown in FIG. 12 is "mm". As shown in FIG. 12, the displacements ΔX, ΔY for each module are stored in the first storage area 67 in relation to the number of times the fork 3 has received a wafer W from the module. Thus, the displacements ΔX, ΔY are stored for each module in a chronological manner.

When an abnormality in a module or in a wafer transport device, such as a transport arm, is estimated as described below, data on the estimated abnormality is stored in the first storage area 67. Every time the control section 6 obtains data on the displacements ΔX, ΔY, the control section 6 calculates the average movement value for each of ΔX and ΔY e.g. for the last 10 displacement data. The average movement value for each module is stored in the first storage area 67 in relation to the history of the operation of receiving a wafer W from the module.

In the second storage area 68 of the storage section 65 is stored data on the positions of the modules, e.g. as data on pulse values outputted from the encoder 59 connected to each motor M. FIG. 13 shows data on the pulse values (number of pulses) of the modules of the unit block B5 as a representative of all the blocks. When the transport arm A5 of the unit block B5 receives a wafer W from a module, control is performed in the following manner: a particular pulse value corresponding to the X-direction position, as shown in the Figure, is outputted from the encoder 59 connected to the motor M1 or M2 which controls the operation of the fork 3 in the X direction; a particular pulse value corresponding to the Y-direction position, as shown in the Figure, is outputted from the encoder 59 connected to the motor M3 which controls the operation of the fork 3 in the Y direction; and a particular pulse value corresponding to the Z-direction position, as shown in the Figure, is outputted from the encoder 59 connected to a motor M which controls the operation of the fork 3 in the Z direction. Thus, the lifting stage 34, the base 31 and the fork 3 of the transport arm A5 move to the module according to the positional data stored in the second storage area 68.

Figure 14:
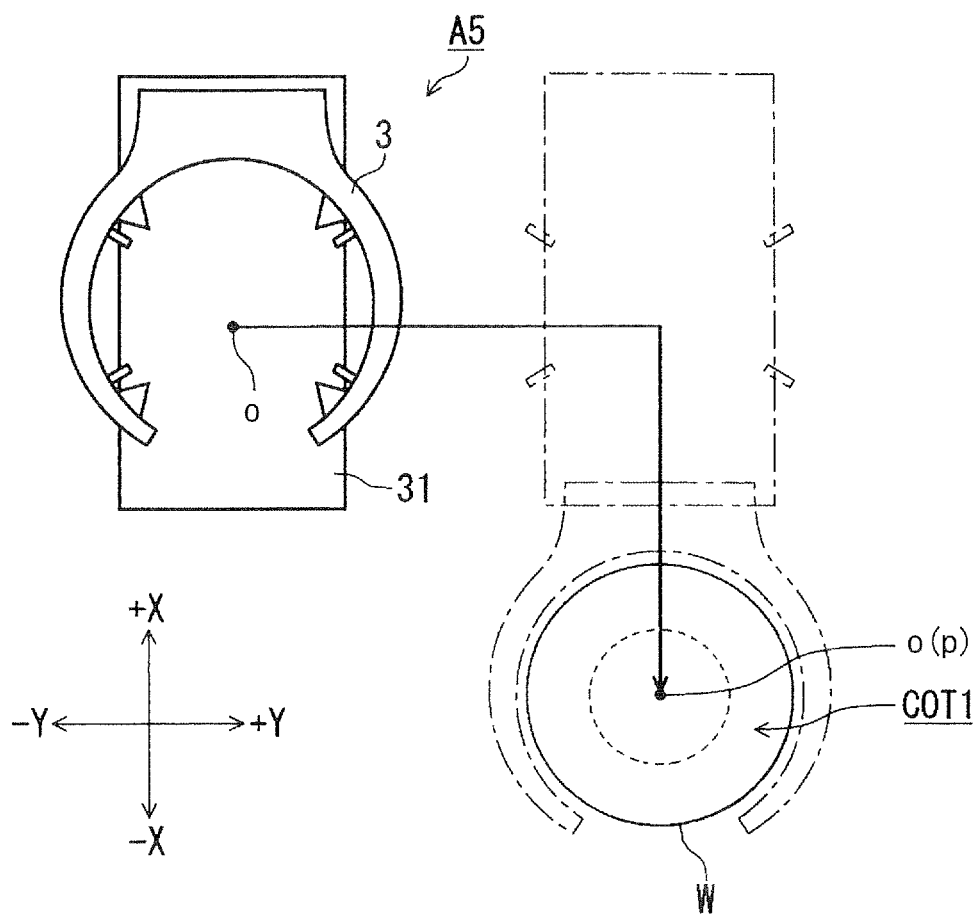
FIG. 14 is a schematic view illustrating transport of a wafer by the transport arm.
Figure 15:
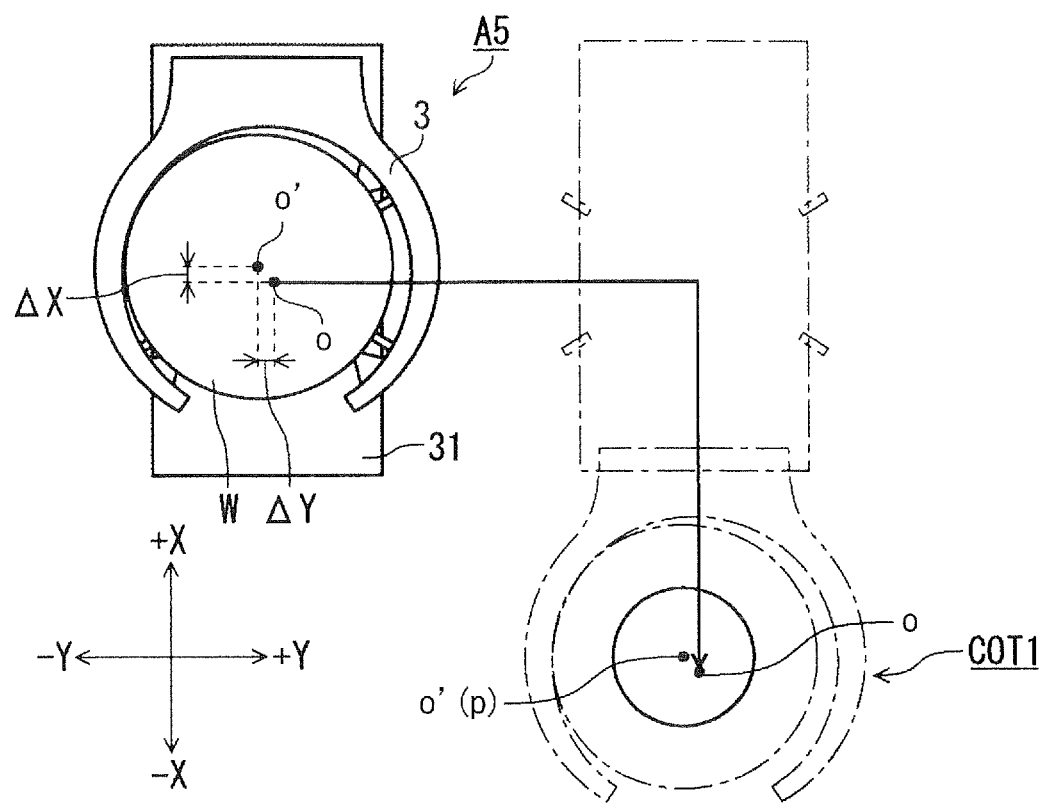
FIG. 15 is a schematic view illustrating transport of a wafer by the transport arm.

Taking the resist coating module COT1 of the unit block B5 as an example, operations for transfer of a wafer W between the module and the transport arm A5 will now be outlined with reference to FIGS. 14 and 15. In these Figures the fork 3 (3A or 3B) and the base 31 are simplified for the convenience of illustration. When the transport arm A5 receives a wafer W from the module COT1 as shown in FIG. 14, the base 31 and the fork 3 of the transport arm A5 move such that the pulse values for the X-direction and Y-direction positions, stored in the second storage area 68 and shown in FIG. 13, are outputted from the encoders 59. If there is no abnormality in the transport arm A5 and the resist coating module COT1, the wafer W is transferred to the module COT1 while the reference position o in the fork 3 moves to a proper position P in the module COT1.

When the fork 3 transfers a wafer W to the module COT1, a preset transfer position (A1, B1) is corrected by the displacements ΔX, ΔY. Thus, as shown in FIG. 15, the center position o' of the wafer W, held by the fork 3, is improperly distant from the module COT1 by the displacements ΔX, ΔY in the X and Y directions. Accordingly, the base 31 and the fork 3 are moved such that the pulse values outputted by the encoders 59 differ from the normal values by pulse values corresponding to the displacements ΔX, ΔY. Thus, the fork 3 is moved in such a manner that it reaches a position which is displaced by the displacements ΔX, ΔY from the preset transfer position so that the center position o' of the wafer W, held by the fork 3, will coincide with the proper position P in the module COT1. The same holds true for the other modules: A wafer W is received by a transport arm A from a module based on data stored in the second storage area 68; and a wafer W is transported to the module while the reference position o in the fork 3 upon transfer of the wafer W is corrected based on the data and on displacements ΔX, ΔY.

The display section 63 is comprised of a computer display screen, for example, a touch panel. Exemplary display screen images of the display section 63 will be described below. The alarm generating section 64 outputs an alarm sound in the event of an estimated abnormality of a module or a substrate transport mechanism so as to inform a user of the estimated abnormality.

While the transport arm A5 has been mainly described, the same holds true for the other substrate transport mechanisms each having the same base and the same forks. Thus, as with the transport arm A5, data on displacements ΔX, ΔY, the positions of modules to be reached by a transport arm, etc. is stored in the storage section 65 every time a substrate transport mechanism transports a wafer W.

The control section 6 determines whether there is an abnormality in a module or in a substrate transport mechanism, such as the transport arm A5, from data on displacements ΔX, ΔY stored in the first storage area 67. Some exemplary abnormalities in modules will now be described. A module, such as a resist coating module COT or a heating module HP, has three lifting pins for pushing up the back surface of a wafer W, held by a fork 3, to force the wafer W out of the fork 3 and receive the wafer W from the fork 3, and a lifting mechanism for vertically moving the lifting pins. The lifting mechanism includes a guide, a cylinder and a driven section. The driven section slides on the guide by the operation of the cylinder, whereby the lifting pins move vertically. In some cases a screw, fixing one of the lifting pins to the lifting mechanism, becomes loosened whereby the heights of the front ends of the lifting pins become uneven. Consequently, when a wafer W is placed on the lifting pins, the wafer W may tilt and slide on the lifting pins, resulting in displacement of the wafer W with respect to the lifting pins.

In some cases, though no abnormality is detected by a sensor for detecting the position of the cylinder, the movement of the driven section on the guide is impeded or stopped momentarily due to an increase in the friction between the guide and the driven section, a scratch or dent formed in the guide, etc. The impact causes a wafer W to bounce on the lifting pins, resulting in displacement of the wafer W with respect to the lifting pins.

A module which supplies a processing liquid to a wafer W, such as a resist coating module COT, has spin chucks which hold a wafer W by attracting the back surface of the wafer W and rotate the substrate W so that a liquid, which has been supplied onto the wafer W, spreads over the wafer W by centrifugal force. When the spin chucks hold a wafer W, they attract the wafer W at a predetermined pressure. A sensor for detecting the pressure indicates a normal value, i.e. detects no abnormality. However, there are cases where the pressure at which the wafer W is held drops momentarily, whereby the wafer W is displaced with respect to the spin chucks due to the centrifugal force produced by the rotation of the wafer W.

Some exemplary abnormalities in substrate transport mechanisms will now be described. As described above with reference to the transport arm A5 as an example, the power of a motor is transmitted to a driven portion via a belt and a pulley(s) in each substrate transport mechanism. Displacement of the belt with respect to the motor can occur due to a decrease in the tension of the belt. This causes displacement of a position where the substrate transport mechanism transfers a wafer W between it and a module. Thus, in this case, the positions of various portions of the substrate transport mechanism, which the control section 6 detects from the pulse values of the encoders 59, do not coincide with the actual positions of the various portions.

In some cases, the movement of a driven section, such as a fork 3 or a frame 35, provided in a substrate transport mechanism, on a guide such as a guide 57, 54A or 54B, is impeded or stopped momentarily due to an increase in the friction between the guide and the driven section, a scratch or dent formed in the guide, etc. This produces a momentum vibration in the substrate transport mechanism, which may cause a wafer W to bounce on the fork 3, resulting in displacement of the wafer W with respect to the fork 3.

In some cases, a substrate transport mechanism in operation interferes with a structure provided along the transport path, resulting in breakage of the fork 3, displacement of the support member 43 supporting the light receivers 42 from a normal position, etc. Thus, the positions of the light receivers 42 with respect to the fork 3 can be displaced, leading to abnormal detection of the position of the wafer W or displacement of the position of the wafer W from a normal position.

If such an abnormality in a module or a substrate transport mechanism is left as it is, displacement of the transfer position of a wafer W with respect to a fork 3 may gradually increase, resulting in an increase in the number of defective wafers W. In view of this, the coating/developing apparatus 1 is configured to estimate such an abnormality in a module or a substrate transport mechanism and to perform a countermeasure operation for an estimated abnormality, as will be described below.

A method for calculating the center position o' of a wafer W and displacements ΔX, ΔY based on positions in a peripheral area (peripheral positions) of the wafer W will now be described with reference to FIG. 11. The points a, b, c and d in FIG. 11 represent those positions in the peripheral area of a wafer W which lie just above the light receivers (LIS) 42 when the wafer W, held by a fork 3, is positioned such that the center position o' of the wafer W coincides with the reference position o of the fork 3. The angles θ1, θ2, θ3 and θ4 represent the angles between the Y-axis and the directions in which the four light receivers 42A to 42D extend, respectively.

The points a', b', c' and d' represent those positions in the peripheral area of a wafer W which lie just above the light receivers 42 when the wafer W, held by the fork 3, is in a displaced position where the center position of the wafer W is displaced from the reference position.

Distances Δa, Δb, Δc and Δd, which are the distance between the points a and a', the distance between the points b and b', the distance between the points c and c' and the distance between the points d and d', respectively, can be determined as follows:

$$\Delta a[\text{mm}] = \{(\text{pixel number at point } a') - (\text{pixel number at point } a)\} \times \text{pixel spacing[mm]} \quad (1)$$

$$\Delta b[\text{mm}] = \{(\text{pixel number at point } b') - (\text{pixel number at point } b)\} \times \text{pixel spacing [mm]} \quad (2)$$

$$\Delta c[\text{mm}] = \{(\text{pixel number at point } c') - (\text{pixel number at point } c)\} \times \text{pixel spacing [mm]} \quad (3)$$

$$\Delta d[\text{mm}] = \{(\text{pixel number at point } d') - (\text{pixel number at point } d)\} \times \text{pixel spacing [mm]} \quad (4)$$

The "pixel number at point a" refers to the number of the pixel, lying just above the point a on the wafer W, of the receiver 42 (42A) in which the linearly-arranged pixels are numbered starting from the innermost one nearest to the center of the wafer W.

The coordinates of the points a to d and the points a' to d' can be expressed as follows:

$$\text{Point } a(X1, Y1) = (X - R \sin \theta 1, Y - R \cos \theta 1) \quad (5)$$

$$\text{Point } a'(X1', Y1') = (X1 - \Delta a \sin \theta 1, Y1 - \Delta a \cos \theta 1) = (X - (R + \Delta a) \sin \theta 1, Y - (R + \Delta a) \cos \theta 1) \quad (6)$$

$$\text{Point } b(X2, Y2) = (X - R \sin \theta 2, Y - R \cos \theta 2) \quad (7)$$

$$\text{Point } b'(X2', Y2') = (X2 - \Delta b \sin \theta 2, Y2 - \Delta b \cos \theta 2) = (X - (R + \Delta b) \sin \theta 2, Y - (R + \Delta b) \cos \theta 2) \quad (8)$$

$$\text{Point } c(X3, Y3) = (X - R \sin \theta 3, Y - R \cos \theta 3) \quad (9)$$

$$\text{Point } c'(X3', Y3')=(X3-\Delta c \sin \theta 3, Y3-\Delta c \cos \theta 3)=(X-(R+\Delta c)\sin \theta 3, Y-(R+\Delta c)\cos \theta 3) \quad (10)$$

$$\text{Point } d(X4, Y4)=(X-R \sin \theta 4, Y-R \cos \theta 4) \quad (11)$$

$$\text{Point } d'(X4', Y4')=(X4-\Delta d \sin \theta 4, Y4-\Delta d \cos \theta 4)=(X-(R+\Delta d)\sin \theta 4, Y-(R+\Delta d)\cos \theta 4) \quad (12)$$

where R is the radius of the wafer W, X and Y are the X-coordinate and the Y-coordinate of the above-described center position o of the wafer W when it is properly held by the fork 3 which has received the wafer W from a module at the transfer position and moved to the backward position. The value of R and the coordinates of the center position o are preset known values.

The coordinates of the point a' (X1', Y1'), the point b' (X2', Y2'), the point c' (X3', Y3') and the point d' (X4', Y4') can be determined by the formulae (6), (8), (10) and (12), respectively.

The coordinates (X', Y') of the center position o' of the wafer W in the displaced position can be calculated from the thus-calculated coordinates of any three of the four points a' to d'. For example, the coordinates (X', Y') of the center position o' can be calculated from the coordinates (X1',Y1'), (X2',Y2') and (X3',Y3') of the points a', b' and C' as follows:

$$X' = \frac{X1'^2(Y3'-Y2')+X2'^2(Y1'-Y3')+X3'^2(Y2'-Y1')-(Y1'-Y3')(Y3'-Y2')(Y2'-Y1')}{2\{X1'(Y3'-Y2')+X2'(Y1'-Y3')+X3'(Y2'-Y1')\}} \quad (13)$$

$$Y' = \frac{Y1'^2(X2'-X3')+Y2'^2(X3'-X1')+Y3'^2(X1'-X2')-(X2'-X3')(X3'-X1')(X1'-X2')}{2\{Y1'(X2'-X3')+Y2'(X3'-X1')+Y3'(X1'-X2')\}} \quad (14)$$

The coordinates of the center position, thus calculated from the coordinates of three of the four peripheral positions, and the radius R' of the wafer W, calculated from the coordinates of one of the three peripheral positions, are used when making the below-described determination of overlap between a notch N formed in a wafer W and the detection range of each detection section 4. When the coordinates of the center position, calculated from the coordinates of the points a', b' and C', are used, the radius R' can be calculated as follows:

$$R'=\sqrt{\{(X'-X1')^2+(Y'-Y1')^2\}} \quad (15)$$

Similarly, the other three combinations of the center position o' and the radius R' can be calculated by using the other combinations of three of the four points a', b', c' and d'. Thus, a total of four combinations of the center position o' and the radius R' can be calculated.

When a notch N, formed in the periphery of the wafer W, does not overlap any of the detection ranges of the detection sections 4A to 4D, as shown in FIG. 11, the four calculation values of the radius R', calculated by using the coordinates of three of the four points a' to d', all fall within a normal range. Accordingly, the difference between the maximum calculation value of the radius R' and the minimum calculation value is not more than a preset threshold value. When the difference is not more than the preset threshold value, therefore, the control section 6 determines that there is no overlap between the notch N and the detection sections 4. The control section 6 then calculates the average of the X-coordinate calculation values and the Y-coordinate calculation values of the four determined center positions o'1 to o'4, and determines the calculated average as the center position o' (X', Y'). Thereafter, the control section 6 calculates displacements ΔX, ΔY of the center position o' (X', Y') from the reference position o (X, Y) in the fork 3, as follows:

$$\Delta X(\text{mm})=X'-X \quad (16)$$

$$\Delta Y(\text{mm})=Y'-Y \quad (17)$$

When the notch N overlaps the detection range of one of the detection sections 4, one of the four calculation values of the radius R' is shorter than the normal range. Accordingly, the calculation of "the maximum value−the minimum value" for the radius R' is more than the threshold value. In that case, the controller 6 slightly moves the fork 3, e.g. forward, so that the notch N moves out of the detection range, and then recalculates displacements ΔX, ΔY by the above-described formulae. The X-coordinate of the reference position o (X, Y), for use in the recalculation, differs from the original value by the forward movement of the fork 3.

The operation the transport arm A5, on behalf of all the substrate transport mechanisms, upon transfer of a wafer W between it and a module will now be described. The following description essentially applies to all the substrate transport mechanisms. The fork 3 (3A or 3B) of the transport arm A5 moves forward on the base 31 in such a manner that the reference position o in the fork 3 comes to coincide with the proper position p in a module, where the fork 3 receives a wafer W. The fork 3 then moves to the backward position. The peripheral portions of the wafer W, held by the fork 3 in the backward position, are irradiated with light emitted by the light sources 41. The control section 6, based on the amounts of light received by the light receivers 42, calculates displacements ΔX, ΔY of the center position o' of the wafer W from the reference position o in the fork 3 and stores the displacement data in the storage section 65. The control section 6 calculates the average movement value of each of ΔX and ΔY for the last 10 displacement data on the same module, and stores the calculated average movement value in the storage section 65.

The control section 6, based on the calculated displacements ΔX, ΔY and on positional data on a module, calculates the position of the fork 3 where the wafer W is transferred to the module. Based on the calculation results, the base 31 moves along the transport path 14 to the calculated Y-direction position, and then the fork 3 moves to the calculated X-direction position, reaching a position where the center position o' of the wafer W, held by the fork 3, coincides with the proper position P in the module. The wafer W is then transferred to the module. The transfer of the wafer W between the module and the fork 3 may be performed by the lifting operation of the fork 3 or by pushing up the wafer W by means of lifting pins provided in the module.

Figure 16:
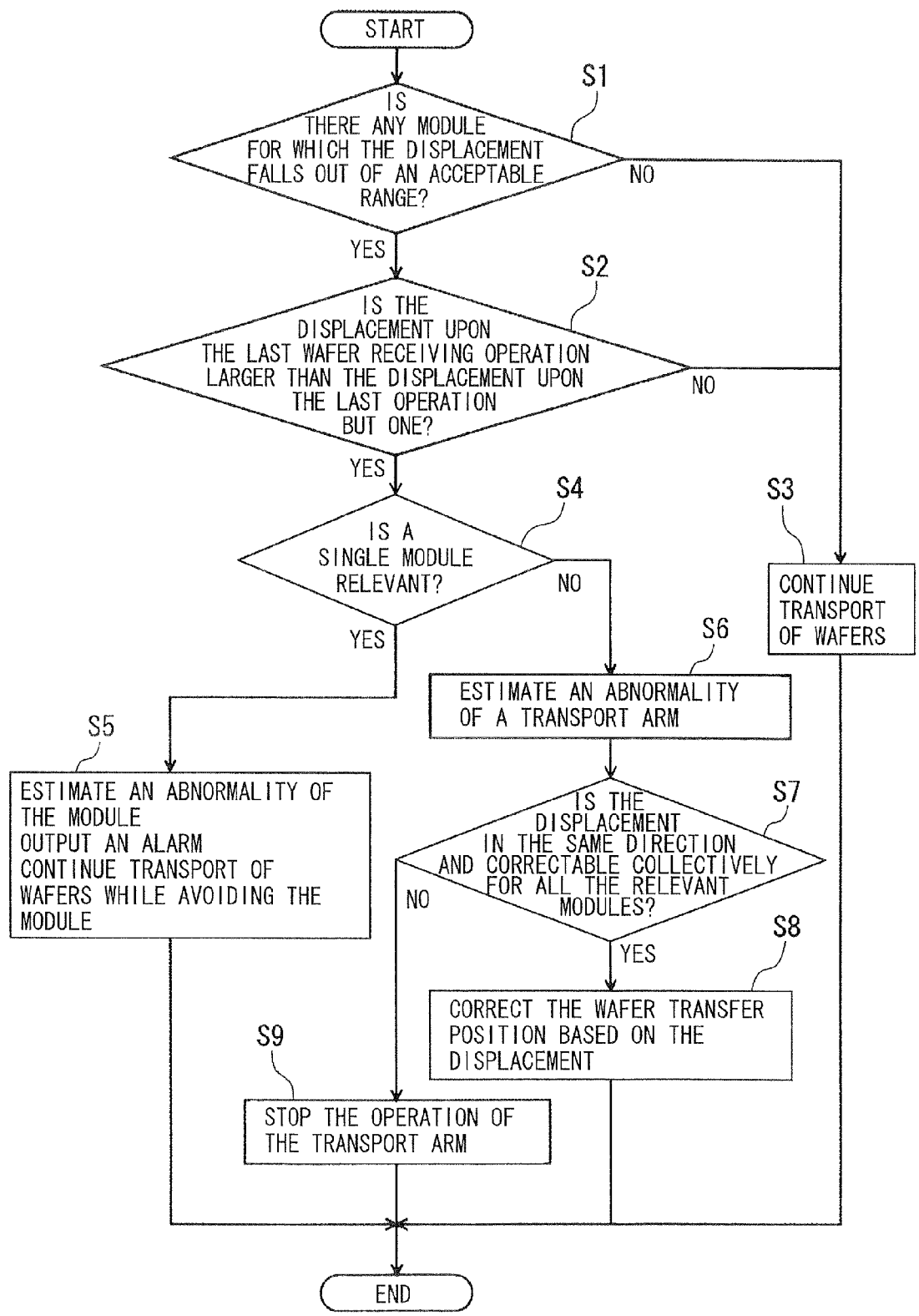
FIG. 16 is a flow chart of the operation of the coating/developing apparatus.

A method for estimating an abnormality of a module or a transport mechanism in the coating/developing apparatus 1 and a method for dealing with the estimated abnormality will now be described with reference to the flow chart of FIG. 16, taking a module in the unit block B5 and the transport arm A5 as a representative example. The control section 6 at an arbitrary time detects from data in the storage section 65 whether, of the modules of the unit block B5, there is a module for which displacements ΔX, ΔY, measured upon the last wafer receiving operation or the last wafer receiving operation but one, do not fall within a preset acceptable range (step S1).

If a module is detected for which the displacements ΔX, ΔY do not fall within the acceptable range, then a determination is made for the module as to whether the average movement value of displacements ΔX, ΔY, obtained upon the last wafer receiving operation, is larger than the average movement value of displacements ΔX, ΔY, obtained upon the last wafer receiving operation but one (step S2). If in step S1 no module is detected for which the displacements do not fall within the acceptable range, then wafer transport is continued in a normal manner. Normal wafer transport is continued also when in step S2, the average movement value of displacements ΔX, ΔY, obtained upon the last wafer receiving operation, is determined to be not larger than the average movement value of displacements ΔX, ΔY, obtained upon the last wafer receiving operation but one (step S3).

If in Step S2 the last average movement value is determined to be larger than the last average movement value but one, a determination is made as to whether one or a plurality of modules is relevant (step S4). If one module is determined to be relevant, then an abnormality in the module is estimated. Data on the estimation is stored in the storage section 65, and an alarm sound is outputted from the alarm generating section 64.

If a module (alternative module) which can perform the same processing as the module with the estimated abnormality exists in the unit block B5, subsequent wafers W are not transported to the problematic module, and are transported to the alternative module. Wafer transport in the unit block B5 is thus continued. If no alternative module exists, subsequent wafers W are not transported to the unit block B5, and are transported to the unit block B6 (step S5).

Figure 17:
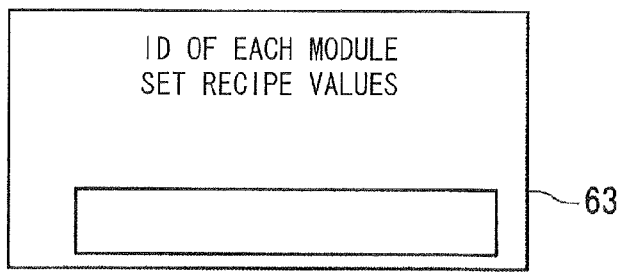
FIG. 17 is a diagram illustrating a display screen provided in the control section.
Figure 18:
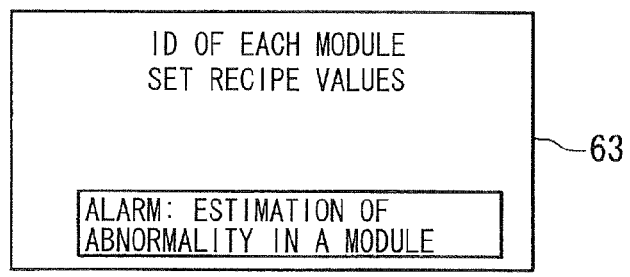
FIG. 18 is a diagram illustrating a display screen provided in the control section.

An exemplary change of display image on the display section 63 with the above-described progress of the process flow will now be described. FIG. 17 illustrates a display screen image when no abnormality is estimated in a module or a transport arm in steps S1 to S4. For example, the ID of each module and numerical values of a processing recipe (processing conditions), set for each module, are displayed e.g. in black and white. FIG. 18 illustrates a display screen image when an abnormality of a module is estimated in steps S5. An alarm indicating the estimated abnormality of the module is displayed on the screen, and the numerical values of the processing recipe, etc. turn into red and begin to blink.

Figure 19:
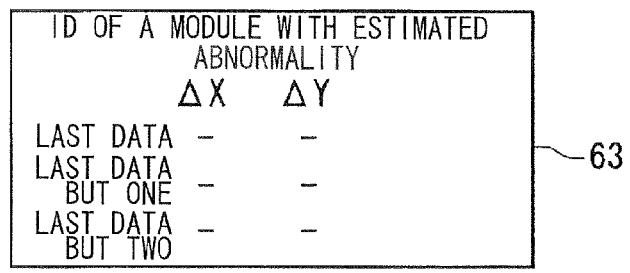
FIG. 19 is a diagram illustrating a display screen provided in the control section.

When the user touches the screen with the alarm displayed on it, the display screen image changes as shown in FIG. 19, and the ID of the module with the estimated abnormality and the last several data on displacements ΔX, ΔY for the module, shown in a chronological manner, are displayed on the screen. Of the displacements displayed, those values which exceed the acceptable range in step S1 are displayed in a predetermined color, e.g. red, whereas those values which are within the acceptable range are displayed in another color, e.g. black. This enables the user to know when (in what wafer receiving operation) displacements ΔX, ΔY have exceeded the acceptable range, making it possible to study the cause of the abnormality. Such a display image on the display section 63 is based on data stored in the storage section 65.

The flow of steps S1, S2, S4, S5 will now be described specifically with reference to the data shown in FIG. 12. Assume that the acceptable range of each of ΔX and ΔY is −0.300 mm to +0.300 mm, the displacements ΔX, ΔY for the heating module HP1, measured upon the last wafer receiving operation and the last but one operation, both do not fall within the acceptable range (step S1). Further, for both of ΔX and ΔY, the average movement value determined upon the last wafer receiving operation is larger than the average movement value determined upon the last wafer receiving operation but one (step S2).

Because only the heating module HP1 meets the determination criteria of steps S1 and S2, an abnormality of the heating module HP1 is estimated. In this embodiment there are the heating modules HP2 to HP8 as alternative modules which can perform the same processing as the heating module HP1. Therefore, subsequent wafers W are not transported to the heating module HP1, and are transported to the heating modules HP2 to HP8 to undergo processing (steps S4, S5). Should the heating modules HP2 to HP8 be not usable and wafer transport in the unit block B5 be not possible, subsequent wafers W, scheduled to be processed in the unit block B5, are transported to the unit block B6 to undergo processing. In this example, for the module with an estimated abnormality, both of ΔX and ΔY fall out of the acceptable range and the average movement value increases in the last data. An abnormality is estimated for a module also when only one of ΔX and ΔY falls out of the acceptable range and the average movement value increases in the last data.

The other steps of the process flow of FIG. 16 will now be described. If a plurality of modules are determined to be relevant in step S4, then an abnormality in the transport arm A5 is estimated, and data on the estimation is stored in the storage section 65. Further, an alarm sound is outputted by the alarm generating section 64 (step S6).

Figure 20:
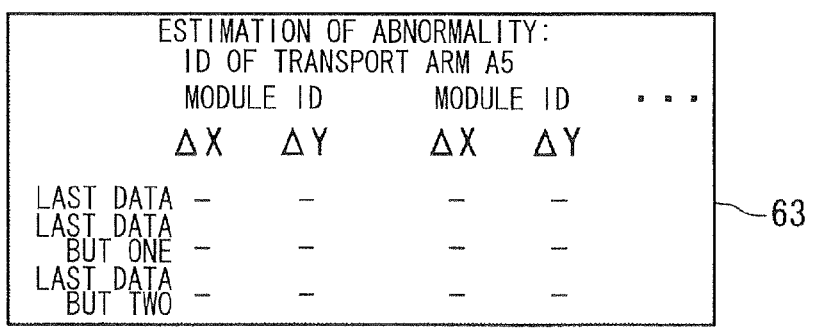
FIG. 20 is a diagram illustrating a display screen provided in the control section.

As with the above-described case of an estimated abnormality in a module, the display screen image of the display section 63 changes upon the estimation of an abnormality in the transport arm A5. Thus, the display screen image changes from that shown in FIG. 17 to that shown in FIG. 18, except that the alarm displayed indicates the estimation of an abnormality in the transport arm A5. When the user touches the screen with the alarm displayed on it, the display screen image changes as shown in FIG. 20, and the ID of the transport arm A5 and the IDs of the modules the transport arm A5 has approached are displayed on the screen. As with the data shown in the above-described FIG. 12 which conceptually illustrates data in the storage section 65, the last several data on displacements ΔX, ΔY for each module are also displayed on the screen in a chronological manner. Such a display image is also based on data stored in the storage section 65.

Of the displacements ΔX, ΔY displayed, those values which have been determined to exceed the acceptable range in step S1 are displayed in red, whereas those values which are within the acceptable range are displayed in another color, e.g. black or white. This enables the user to know where (in what module) and when (in what wafer receiving operation) displacements ΔX, ΔY have exceeded the acceptable range, making it possible to study the cause of the abnormality.

Returning to the flow chart of FIG. 16, the steps subsequent to step S6 will be described. If an abnormality of a transport arm is estimated in step S6, a determination is made in step S7 as to whether a displacement of a wafer W upon its receipt can be corrected by collectively displacing the wafer transfer positions in the X direction and/or the Y direction for all the relevant modules. More specifically, for those modules for which displacements ΔX, ΔY have been determined to be out of the acceptable range in step S1 (herein referred to as "out-of-range modules" for convenience of description), a determination is made as to whether the displacements measured upon the last wafer receiving operation and the displacements measured upon the last wafer receiving operation but one are in the same direction. If the directions (positive or negative) of the both displacements are determined to be the same, then a determination is made as to whether the "the maximum value−the minimum value", calculated for the last displacement values of the out-of-range modules, is not more than a preset reference value.

In particular, if the ΔX values or the ΔY values are out of the acceptable range, a determination is made as to whether the unacceptable displacements ΔX or ΔY measured upon the last wafer receiving operation and the unacceptable displacements ΔX or ΔY measured upon the last wafer receiving operation but one are in the same direction. If the directions (positive or negative) of the both unacceptable displacements ΔX or ΔY are determined to be the same, then a determination is made as to whether the "the maximum value−the minimum value", calculated for the last unacceptable displacement values ΔX or ΔY of the out-of-range modules, is not more than the reference value. If the ΔX values and the ΔY values are out of the acceptable range, a determination is made as to whether the unacceptable displacements ΔX and ΔY measured upon the last wafer receiving operation and the unacceptable displacements ΔX and ΔY measured upon the last wafer receiving operation but one are in the same direction. If the directions are determined to be the same, then a determination is made as to whether the "the maximum value−the minimum value", calculated for the last unacceptable displacement values ΔX and ΔY of the out-of-range modules, is not more than the reference value.

If, as described above, those displacements which are out of the acceptable range are determined to be in the same direction, and the "the maximum value−the minimum value", calculated for the last unacceptable displacement values, are determined to be not more than the reference value, then an average value is calculated for the last displacements of the out-of-range modules. Thus, if the ΔX values or the ΔY values are out of the acceptable range, the average of the ΔX values or the ΔY values is calculated. If the ΔX values and the ΔY values are out of the acceptable range, the average of the ΔX values and the average of the ΔY values are calculated. The pulse value of an encoder, corresponding to the average value, is added to the pulse value stored in the second storage area 68 as data on the wafer transfer position in each module, whereby the data is corrected (step S8). As described above, pulses are outputted from an encoder according to the amount of rotation of each motor M of the transport arm A5. The process step S8 is to correct the position of the base 31 and/or the fork 3, which has been displaced by approximately the same pulse value for all the out-of-range modules, by the pulse value corresponding to the average displacement value.

If, in step S7, those displacements which are out of the acceptable range are determined to be not in the same direction, or the "the maximum value−the minimum value", calculated for the last unacceptable displacement values, are determined to exceed the reference value, then the operation of the transport arm A5 is stopped. Subsequent wafers W, which are scheduled to be processed in the unit block B5, are carried into the unit block B6 together with wafers W which are scheduled to be processed in the unit block B6. Processing in the coating/developing apparatus 1 is thus continued (step S9).

Like FIG. 12, FIG. 21 shows an example of data on displacements stored in the first storage area 67 of the storage section 65. The flow of steps S1, S2, S4 and S6 to S8 will now be described more specifically with reference to the data shown in FIG. 21. Assume that the acceptable range of each of ΔX and ΔY is −0.300 mm to +0.300 mm, the displacements ΔX, ΔY for the resist coating modules COT1 to COT3 and the heating module HP1, measured upon the last wafer receiving operation and the last but one operation, both do not fall within the acceptable range (step S1). Thus, the modules are "out-of-range" modules. Assume that with regard to the other modules not shown in FIG. 21, no wafer has been received from the modules after the occurrence of an abnormality in the transport arm A5, and thus the displacements ΔX, ΔY do not fall out of the acceptable range.

Further, for both of ΔX and ΔY, the average movement value determined upon the last wafer receiving operation is larger than the average movement value determined upon the last wafer receiving operation but one (step S2). Because the plurality of modules thus meet the determination criteria of steps S1 and S2, an abnormality of the transport arm A5 is estimated (steps S4 and S5). For the modules COT1, COT2, COT3, HP1, "the maximum value−the minimum value" for the last ΔX values and "the maximum value−the minimum value" for the last ΔY values are calculated. From the data of FIG. 21, the calculations are specifically as follows: "the maximum value−the minimum value" for the last ΔX values=1.635−1.522=0.113; and "the maximum value−the minimum value" for the last ΔY values=1.090−1.010=0.080. The calculated values are assumed to be not more than a predetermined reference value. Further, the average of the last ΔX values and the average of the last ΔY values are calculated. In this example, the average of ΔX values=(1.522+1.525+1.555+1.635)/4≈1.559, and the average of ΔY values=(1.031+1.035+1.010+1.090)/4≈1.041.

Figure 23:
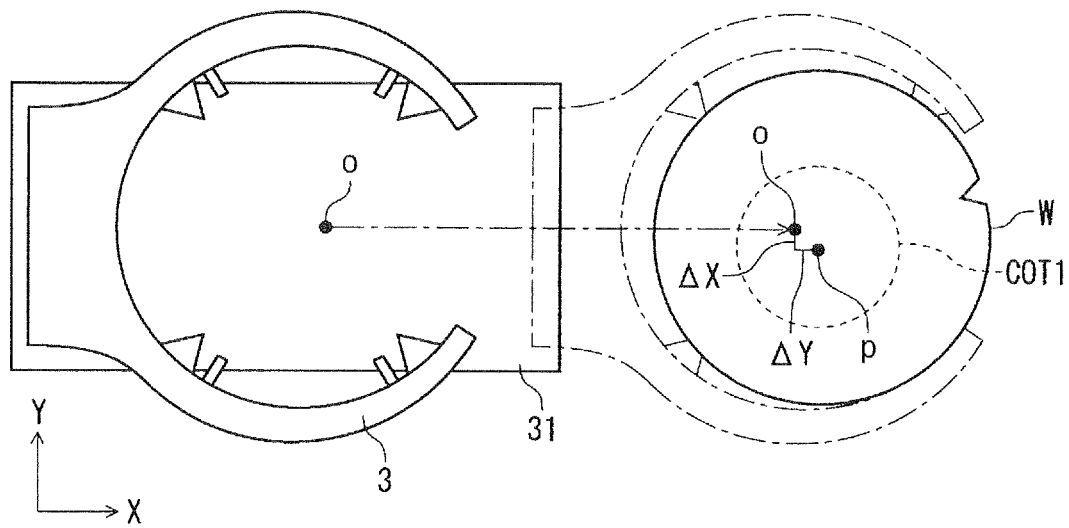
FIG. 23 is a diagram illustrating change of a wafer receiving position.
Figure 24:
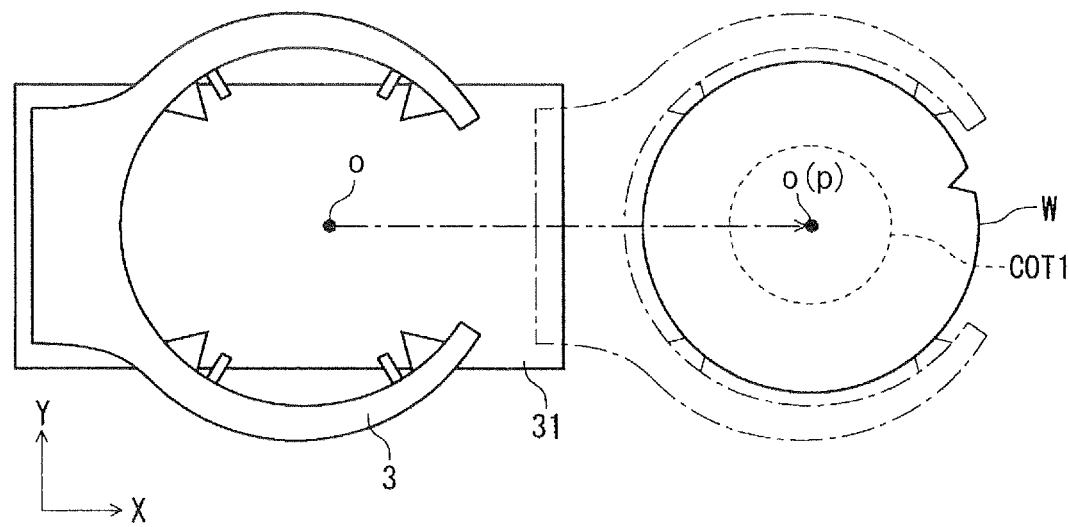
FIG. 24 is a diagram illustrating change of a wafer receiving position.

The average ΔX value and the average ΔY value are each converted into the pulse value of the encoder 59, and the respective pulse values are added to the X-direction position and the Y-direction position shown in FIG. 13, stored as the encoder pulse values in the second storage area 68 of the storage section 65, thereby correcting the X-direction and Y-direction positions as shown in FIG. 22. Depending on the directions of displacements ΔX, ΔY, the correction is subtraction with respect to the stored positions. By making the correction, the reference position o in the fork 3, which has been displaced from the proper position p in a module upon receipt of a wafer W from the module as shown in FIG. 23, comes to approximately coincide with the proper position P as shown in FIG. 24. Thus, the displacements ΔX, ΔY of the center position o' of the wafer W from the reference position o upon receipt of the wafer W by the fork 3 can be reduced or eliminated.

As described above, there are various causes for abnormalities of the transport arm A5. In the case of the above-described displacement of a belt with respect to a motor, the positions of the base 31 and the fork 3, detected by the control section 6, can be made to coincide with the actual positions of the base 31 and the fork 3 by making the above correction. An increase in the displacements ΔX, ΔY can therefore be prevented. However, there are some types of abnormalities for which the displacements ΔX, ΔY cannot be eliminated. It is therefore possible to re-implement the above-described process flow with predetermined timing after making the above-described change in the wafer transfer position. If the abnormality of the transport arm A5 is estimated again, the fact of the abnormality having been uncorrected may be displayed on the display section 63. The step S9 may then be implemented to stop the operation of the transport arm A5 and transport subsequent wafers W to the unit block B6. While the transport arm A5 has been described on behalf of the substrate transport mechanisms, estimation of an abnormality in a module or a substrate transport mechanism and adjustment of the wafer receiving position are performed in the same manner for the other substrate transport mechanisms based on displacements ΔX, ΔY stored in the storage section 65.

According to the coating/developing apparatus 1, an abnormality of a module or a substrate transport mechanism is estimated based on data on displacements ΔX, ΔY stored in the storage section 65. Transport of wafers is controlled in such a manner as to avoid a module for which an abnormality is estimated. In the event of an estimated abnormality in a substrate transport mechanism, the operation of the substrate transport mechanism is stopped, or a wafer receiving position with respect to a module is changed. The coating/developing apparatus 1, because of its capability of early detection of an abnormality in a module or a substrate transport mechanism, can prevent wafers W from continuing to be transported in an abnormal state to a module and continuing to be poorly processed in the module. Further, by transporting wafers W in such a manner as to avoid a module or a substrate transport mechanism for which an abnormality is estimated, or by continuing transport of wafers W after correcting the wafer receiving position, it becomes possible to prevent processing of a wafer W in the coating/developing apparatus 1 from being stopped, thereby preventing lowering of the throughput.

The process flow of steps S1 to S9 may be implemented after a substrate transport mechanism transports a wafer W to a module a particular number of times preset for the substrate transport mechanism or after a substrate transport mechanism has completed transport of one lot of wafers W and before the substrate transport mechanism starts transport of the next lot of wafers W. Alternatively, the process flow may be implemented at predetermined time intervals.

Figure 25:
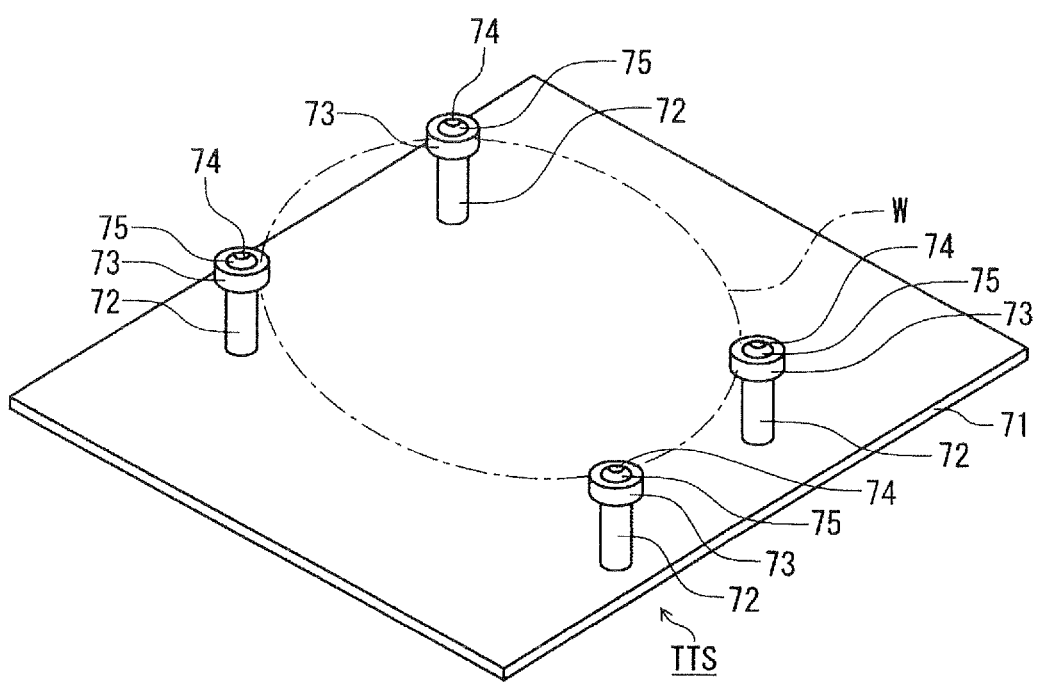
FIG. 25 is a perspective view of a position adjustment module provided in the coating/developing apparatus.

After an abnormality of a substrate transport mechanism is estimated in step S6 of the process flow, the abnormality of the substrate transport mechanism may be confirmed by means of the position adjustment module TTS before correcting the wafer receiving position. FIG. 25 is a perspective view showing the construction of the position adjustment module TTS. The module TTS includes a horizontal plate 71 and four support posts 72 extending vertically from the horizontal plate 71. The support posts 72 are disposed such that when a fork 3, lying above the support posts 72, moves downward as described below, the support posts 72 do not interfere with the holding claws 37 of the fork 3.

A flattened circular support portion 73 is provided on the top of each support post 72. A guide portion 74, having a circular shape in a plan view, is provided on the support portion 73. The diameter of the guide portion 74 decreases with height. The bottom of the guide portion 74 lies inside the peripheral edge of the upper surface of the support portion 73, so that a peripheral portion of a wafer W can be supported on the upper surface of the support portion 73. The side surface of the guide portion 74 serves as a guide surface 75 for allowing the periphery of a wafer W to slide down onto the support portion 73.

Figure 26:
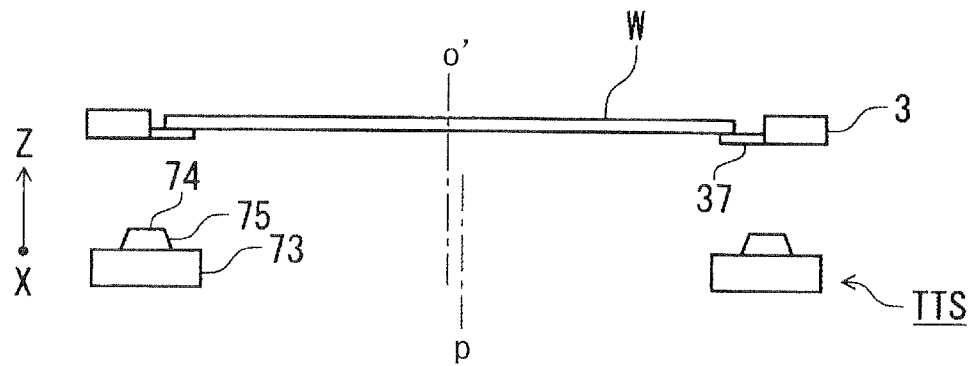
FIG. 26 is a front view illustrating transfer of a wafer between the transport arm and the position adjustment module.
Figure 27:
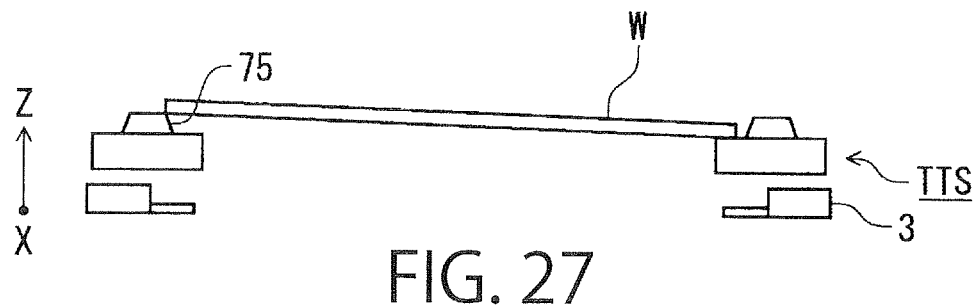
FIG. 27 is a front view illustrating transfer of a wafer between the transport arm and the position adjustment module.
Figure 28:
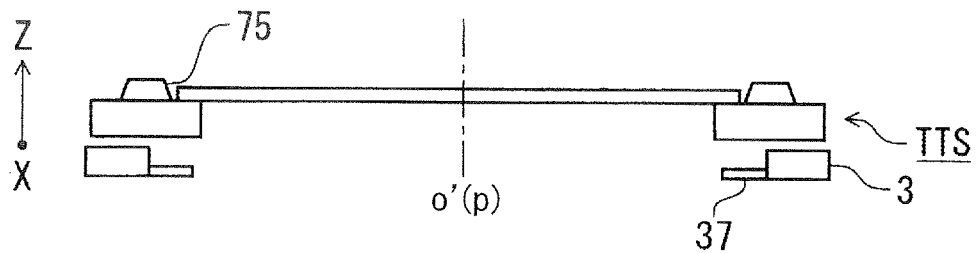
FIG. 28 is a front view illustrating transfer of a wafer between the transport arm and the position adjustment module.
Figure 29:
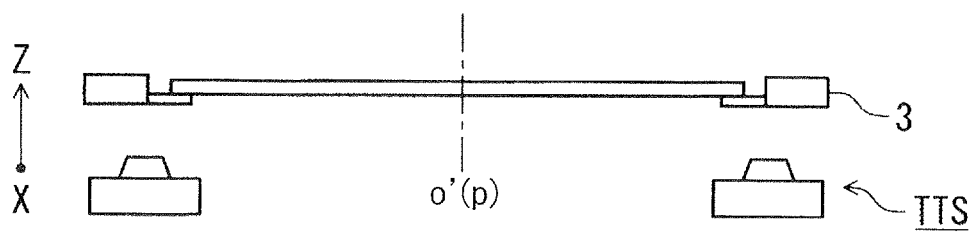
FIG. 29 is a front view illustrating transfer of a wafer between the transport arm and the position adjustment module.

The operation of the transport arm A5 after the estimation of an abnormality will now be described with reference to FIGS. 26 through 29 showing a front view of the position adjustment module TTS and the fork 3. The transport arm A5, holding a wafer W, moves to the module TTS based on data stored in the second storage area 68 of the storage section 65. As described above, the wafer transfer position is corrected by the displacements $\Delta X$, $\Delta Y$ of the wafer W. The fork 3, holding the wafer W and which has moved to above the module TTS, moves downward such that it surrounds the support portions 73 of the module TTS (FIG. 26). If the transport arm A5 has an abnormality and the center position o' of the wafer W is displaced from a proper position p in the module, the periphery of the substrate W, moving downward, comes into contact with the guide surface 75 of a guide portion(s) 74 when the wafer W is transferred from the fork 3 to the module TTS (FIG. 27). The periphery of the wafer W slides down the guide surface 75, and reaches the upper surface of the support portion 73. The center position o' of the wafer W, thus held on the support portions 73, coincides with the proper position p in the module (FIG. 28).

Thereafter, the fork 3 moves upward and receives the wafer W (FIG. 29), and then the fork 3 moves backward and displacements $\Delta X$, $\Delta Y$ are detected. Because of positional displacements in the X and Y directions, produced upon sliding of the wafer W on the guide surface 75, displacements $\Delta X$, $\Delta Y$ before transfer of the wafer W to the module TTS differ from those after transfer of the wafer W to the module TTS. The control section 6 calculates the difference in the displacements before and after transfer of the wafer W to the module TTS. If the difference value exceeds an acceptable range, the confirmation of the abnormality of the transfer arm A5 is displayed on the display section 63.

The X-direction position of each module, stored in the second storage area 68 as shown in FIGS. 13 and 22, is corrected by the pulse value corresponding to the $\Delta X$ difference value, while the Y-direction position of each module is corrected by the pulse value corresponding to the $\Delta Y$ difference value. As with the step S8 of the above-described process flow, the wafer transfer positions are changed by the correction collectively for all the relevant modules. If the transport arm A5 has no abnormality, the fork 3 is positioned such that the center position o' of the wafer W coincides with the proper position p in the module TTS before transfer of the wafer W to the module US. Accordingly, no displacement occurs in the X and Y directions due to sliding of the wafer W on the guide surface 75. The difference in the displacements $\Delta X$, $\Delta Y$ before and after transfer of the wafer W to the module TTS therefore falls within the acceptable range. The confirmation of no abnormality of the transfer arm A5 is displayed on the display section 63; and wafer transport in the unit block B5 is continued.

An abnormality of the transport arm A5 can thus be detected more securely by using the module TTS. The operation of transferring a wafer W to the module TTS thus is an operation to confirm a displacement of the fork 3 with respect to the proper position p in the module TTS. The confirmation of the displacement makes it possible to correct the positional data on each module with higher accuracy. However, the above-described correction method, not involving transport of a wafer W to the module TTS, can thereby increase the throughput. The user can arbitrarily choose, from a not-shown setting section of the control section 6, whether or not to use the module TTS for changing the wafer receiving position.

When adjusting the wafer receiving position of a transport arm in the x and Y directions by using the module TTS, the Z-direction (vertical-direction) position of the transport arm can be adjusted. Taking the transport arm A5 as a representative example, a pressure sensor is provided in the piping 39 connected to the vacuum suction openings 38 of the transport arm A5. The detection value of the pressure sensor will change when a wafer W is held by the fork 3 and the vacuum suction openings 38 are closed by the wafer W. When the fork 3 receives a wafer W from the module TTS after once transferring the wafer W to the module TTS, the control section 6 compares a Z-direction position where the detection value of the sensor changes and a Z-direction position stored in the second storage area 68 and, if the positions are displaced from each other, corrects the Z-direction position of each module, stored in the second storage area 68, according to the displacement.

As described above, a plurality of US modules are provided each in a position accessible by a substrate transport mechanism. The substrate transport mechanisms other than the transport arm A5 perform the same operation to confirm an abnormality and correct the wafer transfer position. The adjustment of the Z-direction wafer transfer position may be performed not by transferring a wafer W to a module TTS, but by transferring a wafer W to one of the other modules, such as the resist coating modules COT1 to COT3. Thus, in performing the above-described method for adjusting the wafer transfer position of a substrate transport mechanism in the X and Y directions without using a module TTS, an adjustment of the Z-direction wafer transfer position may be made by using a module other than the module TTS. Alternatively, an adjustment of the wafer transfer position of a substrate transport mechanism in each direction may be made using the module TTS after adjusting the tension of each belt of the substrate transport mechanism in a maintenance work. This method enables quick adjustment of the wafer transfer position, and can therefore reduce the time required for maintenance.

An adjustment of the position of a substrate transport mechanism using the module TTS may be made in cases other than the case where an abnormality is estimated in the substrate transport mechanism. In one example, the control section 6 monitors the operating time of the coating/developing apparatus 1 and, when a predetermined operating time has elapsed, makes a positional adjustment of a substrate transport mechanism. In another example, the control section 6 monitors the number of lots of wafers W which have finished processing in the coating/developing apparatus 1 and, when processing of a predetermined number of lots has been completed, makes a positional adjustment of a substrate transport mechanism. Such a manner of positional adjustment can quickly correct a failure of a substrate transport mechanism, such as the above-described displacement of a belt with respect to a motor, which may occur with the passage of time.

In the coating/developing apparatus 1, estimation of an abnormality and outputting of an alarm may not be performed by the control section 6. In that case, displacements stored in the storage section 65 are displayed on the display section 63, and the user, based on the display, makes an estimation of an abnormality in a module or a substrate transport mechanism. When an abnormality is estimated, the user itself performs a countermeasure operation for the estimated abnormality, such as stopping of wafer transport to a module for which the abnormality is estimated or stopping of the operation of a substrate transport mechanism, by means of the control section 6. In the case where the user itself makes the estimation, the data on displacements ΔX, ΔY displayed on the display section may be either all the data obtained for the relevant module(s) or only those data which fall out of an acceptable range. Alternatively, data on displacements ΔX, ΔY may be obtained for each module only once at an arbitrary time during transport of wafers W. The data is displayed on the display section 63 so that the user makes the abnormality estimation. Displacements ΔX, ΔY of a wafer W may not necessarily be detected by the method described above. For example, a method may be used in which a camera for imaging the wafer receiving position is provided on the base 31, and an image taken by the camera is compared with a prepared reference image to detect displacements ΔX, ΔY of a wafer W. The present invention can be applied not only to transport of wafers W but also to transport of other types of substrates, such as LCD substrates. The detection sections 4 may not necessarily be provided on the support 31, and may be provided on a substrate transport path.

Though in the above-described embodiment the wafer transfer positions for all the relevant modules are corrected collectively, it is also possible to correct the wafer transfer positions individually for each module based on the displacement data obtained for each module. In the above-described process step of determining whether displacements ΔX, ΔY are each in the same direction in the last two consecutive data, the "same direction" may not necessarily be the same positive or negative direction. For example, a vector connecting the reference position o in a fork 3 and the center position o' of a wafer W is determined from the displacement data obtained for each module. It is possible to determine the displacement to be in the same direction when the direction of the vector falls within a predetermined range. Though in the above-described embodiment data on displacements ΔX, ΔY is stored in the storage section every time a substrate transport mechanism receives a wafer W from each module, it is also possible to store such data e.g. once every other wafer receiving operation.

What is claimed is:

1. A substrate processing apparatus for processing a substrate while transferring the substrate between modules, comprising:
a substrate transport mechanism including a substrate holder for holding a substrate and which is movable laterally for transfer of the substrate between modules;
a plurality of modules from which the substrate holder receives a substrate;
a sensor section for detecting a displacement of the holding position of a substrate, held by the substrate holder, from a reference position preset in the substrate holder;
a storage section for storing the displacement, detected when the substrate holder receives a substrate from each of the modules, in a chronological manner for each module;
an estimation section for estimating a failure of one of the modules or the substrate transport mechanism based on the chronological data on the displacement for each module, stored in the storage section, and
a control means which, based on the results of estimation in the estimation section, outputs a control signal to control the operation of the substrate transport mechanism, wherein the plurality of modules includes an adjustment module and when a failure of the substrate transport mechanism is estimated in the estimation section, the control means outputs a control signal to cause the substrate transport mechanism to transfer a substrate to the adjustment module, and then receive the substrate from the adjustment module, and wherein the control means, based on the difference between the displacement detected before transfer of the substrate to the adjustment module and the displacement detected after receipt of the substrate from the adjustment module, changes the position of the substrate holder on receipt of a substrate from each module from a preset first position to a second position.

2. The substrate processing apparatus according to claim 1, further comprising an alarm output means for outputting an alarm when a failure of one of the modules or the substrate transport mechanism is estimated in the estimation section.

3. A substrate processing method using a substrate processing apparatus for processing a substrate while transferring the substrate between modules, said method comprising the steps of:
moving a substrate holder, provided in a substrate transport mechanism, laterally to each of the modules;
allowing the substrate holder to receive a substrate from each of the modules;
detecting a displacement of the holding position of the substrate, held by the substrate holder, from a reference position preset in the substrate holder by means of a sensor section;
storing the displacement, detected when the substrate holder receives a substrate from each of the modules, in a storage section in a chronological manner for each module; and estimating, by means of an estimation section, a failure of one of the modules or the substrate transport mechanism based on the chronological data on the displacement for each module, stored in the storage section, wherein the modules include an adjustment module, wherein the operation of the substrate transport mechanism is controlled based on the results of estimation in the estimation section, and wherein the operation of the substrate transport mechanism is controlled by the following steps to be performed when a failure of the substrate transport mechanism is estimated in the estimation section:

allowing the substrate transport mechanism to transfer a substrate to the adjustment module;

allowing the substrate transport mechanism to receive the substrate from the adjustment module;

calculating the difference between the displacement detected before transfer of the substrate to the adjustment module and the displacement detected after receipt of the substrate from the adjustment module; and changing, based on the calculated difference, the position of the substrate holder on receipt of a substrate from each module from a preset first position to a second position.

4. The substrate processing apparatus according to claim 3, wherein an alarm is outputted when a failure of one of the modules or the substrate transport mechanism is estimated in the estimation section.

5. A non-transitory storage medium storing a computer program for use in a substrate processing apparatus, having a plurality of modules, for processing a substrate while transferring the substrate between modules, said computer program being for implementing the substrate processing method according to claim 3.

* * * * *